(12) United States Patent
Tahara et al.

(10) Patent No.: US 11,011,299 B2
(45) Date of Patent: May 18, 2021

(54) TERMINAL PLATE MEMBER OF COIL COMPONENT AND METHOD FOR MANUFACTURING ELECTRONIC COMPONENT

(71) Applicant: SUMIDA CORPORATION, Tokyo (JP)

(72) Inventors: Yoshiyuki Tahara, Natori (JP); Teruaki Tanaka, Natori (JP); Akihiko Nakamura, Natori (JP); Satoru Yamada, Natori (JP); Mitsugu Kawarai, Natori (JP)

(73) Assignee: SUMIDA CORPORATION

( * ) Notice: Subject to any disclaimer, the term of this patent is extended or adjusted under 35 U.S.C. 154(b) by 801 days.

(21) Appl. No.: 15/662,485

(22) Filed: Jul. 28, 2017

(65) Prior Publication Data
US 2018/0061558 A1 Mar. 1, 2018

(30) Foreign Application Priority Data

Sep. 1, 2016 (JP) .............................. JP2016-171268
Apr. 6, 2017 (JP) .............................. JP2017-076235

(51) Int. Cl.
*H01F 27/29* (2006.01)
*H01F 41/10* (2006.01)
(Continued)

(52) U.S. Cl.
CPC ........... *H01F 27/292* (2013.01); *H01F 17/04* (2013.01); *H01F 27/24* (2013.01); *H01F 27/28* (2013.01);
(Continued)

(58) Field of Classification Search
None
See application file for complete search history.

(56) References Cited

U.S. PATENT DOCUMENTS

| 7,327,212 B2* | 2/2008 | Sano | ...................... H01F 27/027 336/192 |
| 2002/0011909 A1* | 1/2002 | Wu | ....................... H01F 27/027 336/65 |

(Continued)

FOREIGN PATENT DOCUMENTS

| JP | H07-320938 A | 12/1995 |
| JP | 2015-201537 A | 11/2015 |

OTHER PUBLICATIONS

Extended European Search Report for EP Application No. 17187051.2, dated Feb. 21, 2018; 5 pages.

*Primary Examiner* — Ronald Hinson
(74) *Attorney, Agent, or Firm* — Harness, Dickey & Pierce, P.L.C.

(57) ABSTRACT

A terminal plate member on which a terminal of a coil component is mounted including: an annular frame having an inner peripheral edge; a pair of extension members extending from the inner peripheral edge of the annular frame toward an inner space of the annular frame member in a first direction; and a deformable section provided in the annular frame at proximal end of one of the pair of extension members, the deformable section having a more easily deformable property than other sections of the annular frame when force is applied. The deformable section is provided along at least an entire width in a second direction of the one of the pair of extension members. The second direction is perpendicular to the first direction.

7 Claims, 15 Drawing Sheets

(51) Int. Cl.
*H01F 41/02* (2006.01)
*H01F 17/04* (2006.01)
*H01F 27/24* (2006.01)
*H01F 27/28* (2006.01)
*H01F 27/30* (2006.01)
*H05K 13/04* (2006.01)

(52) U.S. Cl.
CPC ....... *H01F 27/306* (2013.01); *H01F 41/0206* (2013.01); *H01F 41/0246* (2013.01); *H01F 41/10* (2013.01); *H05K 13/04* (2013.01); *H01F 2017/048* (2013.01)

(56) References Cited

U.S. PATENT DOCUMENTS

2012/0268232 A1 10/2012 Yamada et al.
2014/0090235 A1 4/2014 Yamada et al.

* cited by examiner

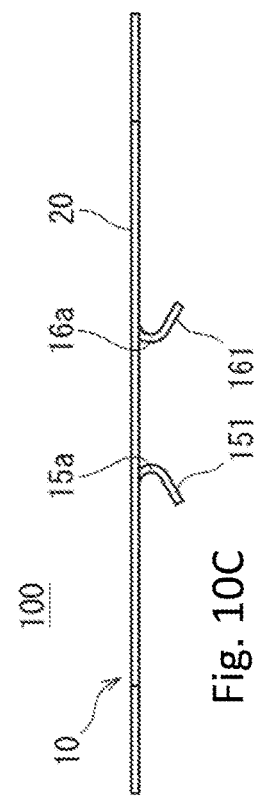
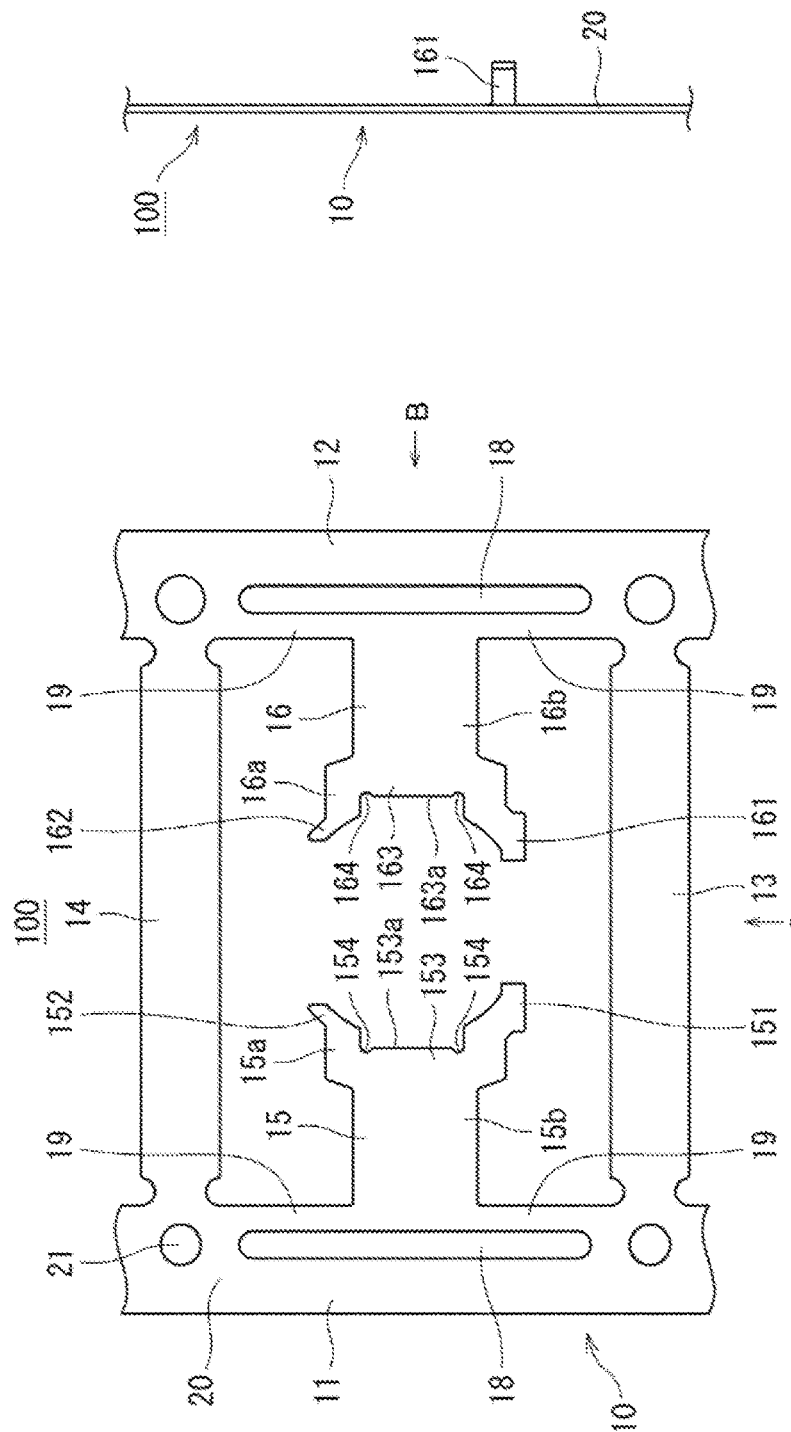
Fig. 10A
Fig. 10B
Fig. 10C

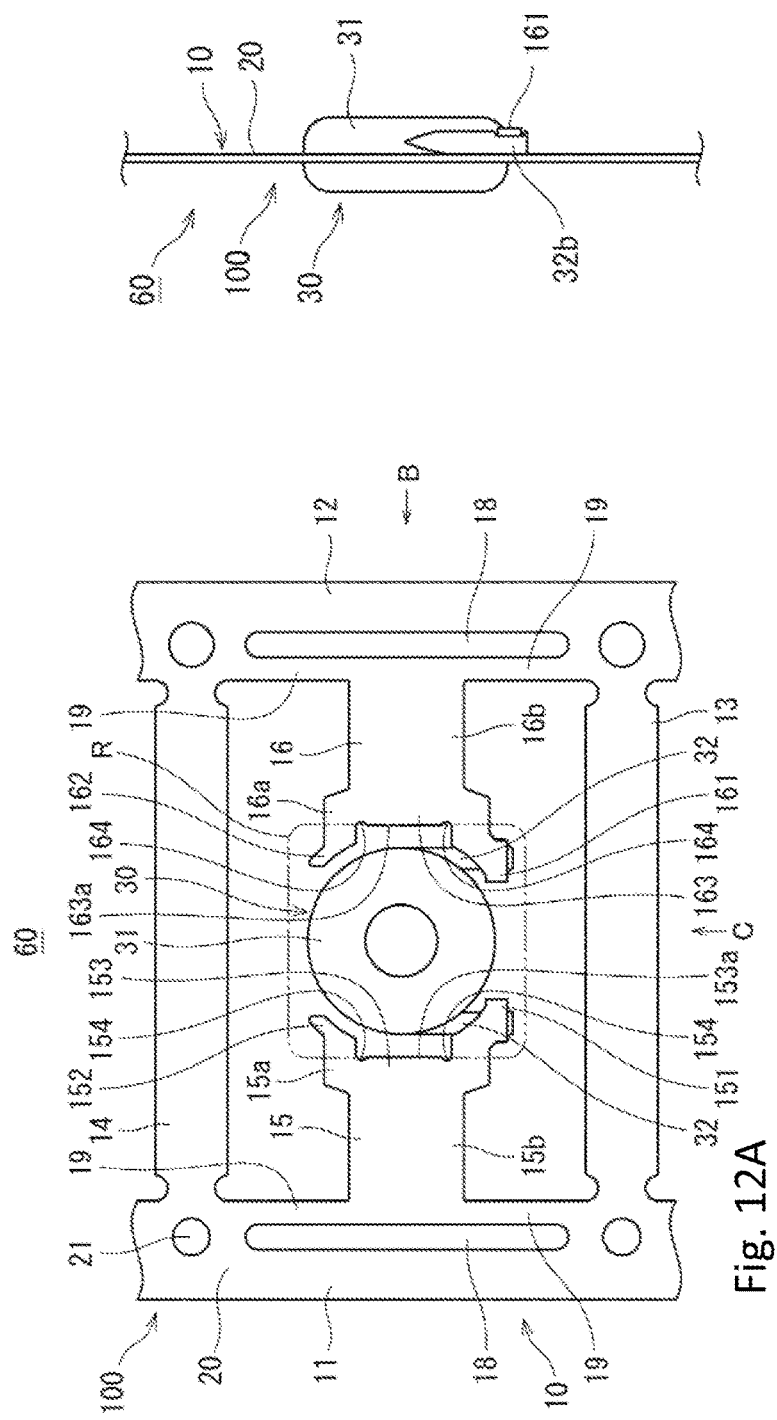
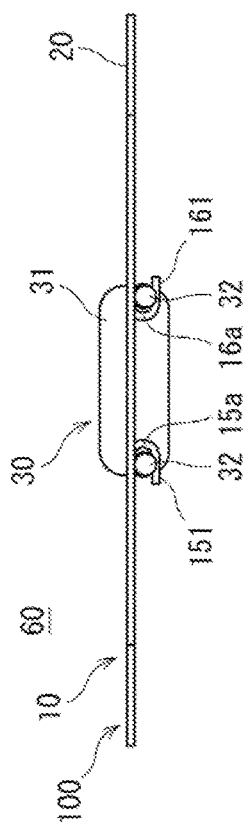
Fig. 12A
Fig. 12B
Fig. 12C

TERMINAL PLATE MEMBER OF COIL COMPONENT AND METHOD FOR MANUFACTURING ELECTRONIC COMPONENT

CROSS-REFERENCE TO RELATED APPLICATION

This application claims priority to Japanese Patent Applications No. 2016-171268 filed Sep. 1, 2016, and No. 2017-076235 filed Apr. 6, 2017 which are hereby expressly incorporated by reference herein in their entirety.

BACKGROUND

The present invention relates to a terminal plate member (a plate member for a terminal) of a coil component and a method for manufacturing an electronic component.

In Japanese Patent Publication No. 2015-201537, there is the description that a magnetic core is formed by covering a circumference of a winding section of a coil component with magnetic powder and pressurizing the magnetic powder. A pair of terminals project from the winding section of the coil component. The formation of the magnetic core is performed in a state in which the coil component is positioned relative to a terminal plate member. The terminal plate member has an annular frame member and a pair of extension members that respectively extend from an inner peripheral edge of the frame member toward an inside of the frame member. In a state in which each terminal of the coil component is located at each of the extension members of the terminal plate member, the winding section of the coil component and tips of the extension members are covered with the magnetic powder and the magnetic powder is pressurized. As a result, the magnetic core is formed. Each of the extension members and each of the terminals project from the magnetic core.

According to inventors' investigation of the present application, when a magnetic core is formed by pressurizing a magnetic powder, a deformation (a strain) of a terminal plate member may occur because a terminal of a coil component is displaced in an extending direction. In this case, with respect to the magnetic core, a stress is locally applied to the portion in which the extension member and the terminal project. Therefore, there is a possibility that a crack is generated at that portion of the magnetic core.

SUMMARY

The present invention attempts to solve these problems. An object of the present invention is to provide a terminal plate member of a coil component and a method for manufacturing an electronic component in which the terminal plate member is used. Specifically, the terminal plate member has a configuration for suppressing a deformation (a strain) when a magnetic core is formed by pressurizing a magnetic powder that covers the coil component.

In order to achieve the above object, a terminal plate member according to one aspect of the present invention includes: an annular frame having an inner peripheral edge; a pair of extension members extending from the inner peripheral edge of the annular frame toward an inner space of the annular frame member in a first direction; and an easily-deformable section provided in the annular frame at a proximal end of one of the pair of extension members, the easily-deformable section having a more easily deformable property than other sections of the annular frame when force is applied. The easily-deformable section is provided along at least an entire width in a second direction of the one of the pair of extension members. The second direction is perpendicular to the first direction.

In a terminal plate member, according to another aspect of the present invention, the easily-deformable section is one of a through hole and a thin member. A thickness of the thin member is thinner than a thickness of the other sections.

In a terminal plate member, according to another aspect of the present invention, a length of the easily-deformable section in the second direction is longer than a length of the entire width in the second direction of the one of the pair of extension members.

In a terminal plate member, according to another aspect of the present invention, the easily-deformable section is an elongated through hole. The elongated through hole extends in the second direction. The annular frame includes: an annular part having the inner peripheral edge; and a pair of connection parts extending along the elongated through hole. The pair of connection parts connecting bases of the pair of extension members to the annular frame, respectively. A first location of each of the pair of connection parts corresponding to each of the bases has a first notch. A second location located an end of each of the pair of connection parts has a second notch.

In a terminal plate member, according to another aspect of the present invention, the entire width in the second direction of the one of the pair of extension members is larger than a width of the terminal of the coil component.

In a terminal plate member, according to another aspect of the present invention, the annular frame has a positioning hole. The terminal plate is positioned relative to another member by using the positioning hole.

In a terminal plate member, according to another aspect of the present invention, the annular frame has a first clamping holder. The first clamping holder holds a tip part of the terminal of the coil component by clamping. The easily-deformable section is located between the first clamping holder and the one of the pair of extension members in a plan view.

In a terminal plate member, according to another aspect of the present invention, each tip of each of the pair of extension members has a pair of branches in a bifurcated shape. One of the pair of branches is a second clamping holder. The second clamping holder holds the terminal of the coil component by clamping.

In a terminal plate member, according to another aspect of the present invention, the second clamping holder rises from a top surface of the annular frame.

In a manufacturing method for an electronic component, according to another aspect of the present invention, the manufacturing method including: providing the terminal plate member mentioned above; providing a coil component, the coil component being mounted on the terminal plate member, the coil component including: a winding section around which a conductive wire is wound; and a pair of coil terminals that extend from the winding section in a second direction; forming a semifinished product by placing each of the pair of coil terminals on each of the pair of extension members so that the coil component and the terminal plate member are mutually combined; covering the semifinished product with a magnetic powder after the semifinished product is placed in a mold; and pressurizing the magnetic powder so as to form a magnetic core. The pair of extension sections are displaced in the second direction during the pressurizing. The displacement is absorbed by the easily-deformable section.

In a manufacturing method for an electronic component, according to another aspect of the present invention, the manufacturing method including: providing the terminal plate member mentioned above; providing a coil component, the coil component being mounted on the terminal plate member, the coil component including: a winding section around which a conductive wire is wound; and a pair of coil terminals that extend from the winding section; forming a semifinished product by placing each of the pair of coil terminals on each of the pair of extension members so that the coil component and the terminal plate member are mutually combined; covering the semifinished product with a magnetic powder after the semifinished product is placed in a mold; and pressurizing the magnetic powder so as to form a magnetic core. The pair of extension sections are displaced in the first direction during the pressurizing. The displacement is absorbed by the easily-deformable section.

In the manufacturing method for an electronic component, according to the above aspects of the present invention, the easily-deformable section is one of a through hole and a thin member. A thickness of the thin member is thinner than a thickness of the other sections.

In the manufacturing method for an electronic component, according to the above aspects of the present invention, a length of the easily-deformable section in the second direction is longer than a length of the entire width in the second direction of the one of the pair of extension members.

In the manufacturing method for an electronic component, according to the above aspects of the present invention, the easily-deformable section is an elongated through hole, and the elongated through hole extends in the second direction. The annular frame includes: an annular part having the inner peripheral edge; and a pair of connection parts extending along the elongated through hole, the pair of connection parts connecting bases of the pair of extension members to the annular frame, respectively. A first location of each of the pair of connection parts corresponding to each of the bases has a first notch. A second location located at an end of each of the pair of connection parts has a second notch.

In the manufacturing method for an electronic component, according to the above aspects of the present invention, the annular frame has a first clamping holder. The first clamping holder holds a tip part of the terminal of the coil component by clamping. The easily-deformable section is located between the first clamping holder and the one of the pair of extension members in a plan view.

According to the above aspects of the present invention, it is possible to suppress a deformation (a strain) of the terminal plate member when the magnetic core is formed by pressurizing the magnetic powder that covers the coil component.

BRIEF DESCRIPTION OF THE DRAWINGS

FIG. 9A is a plan view. Further, FIG. 9B is a side view when viewed in a direction of the arrow B shown in FIG. 9A.

FIGS. 10A, 10B and 10C are views that show the terminal plate member according to the second embodiment of the present invention, and show a state in which a second clamping holding member is bent. Specifically, FIG. 10A is a plan view. Further, FIG. 10B is a side view when viewed in a direction of the arrow B shown in FIG. 10A. Lastly, FIG. 10C is a front view when viewed in a direction of the arrow C shown in FIG. 10A.

FIG. 11A is a plan view. Further, FIG. 11B is a side view when viewed in a direction of the arrow B shown in FIG. 11A. Lastly, FIG. 11C is a cross sectional view along the C-C line shown in FIG. 11A.

FIGS. 12A, 12B and 12C are views that show a method for manufacturing an electronic component by using the terminal plate member according to the second embodiment of the present invention. Specifically, FIG. 12A is a plan view. Further, FIG. 12B is a side view when viewed in a direction of the arrow B shown in FIG. 12A. Lastly, FIG. 12C is a front view when viewed in a direction of the arrow C shown in FIG. 12A.

FIG. 14A is a plan view. Further, FIG. 14B is a cross sectional view along the A-A line shown in FIG. 14A.

FIG. 15A is a bottom view. Further, FIG. 15B is a perspective view. Lastly, FIG. 15C is a front cross sectional view in the same state as FIG. 15B.

DESCRIPTION OF EXEMPLARY EMBODIMENTS

Figure 1:
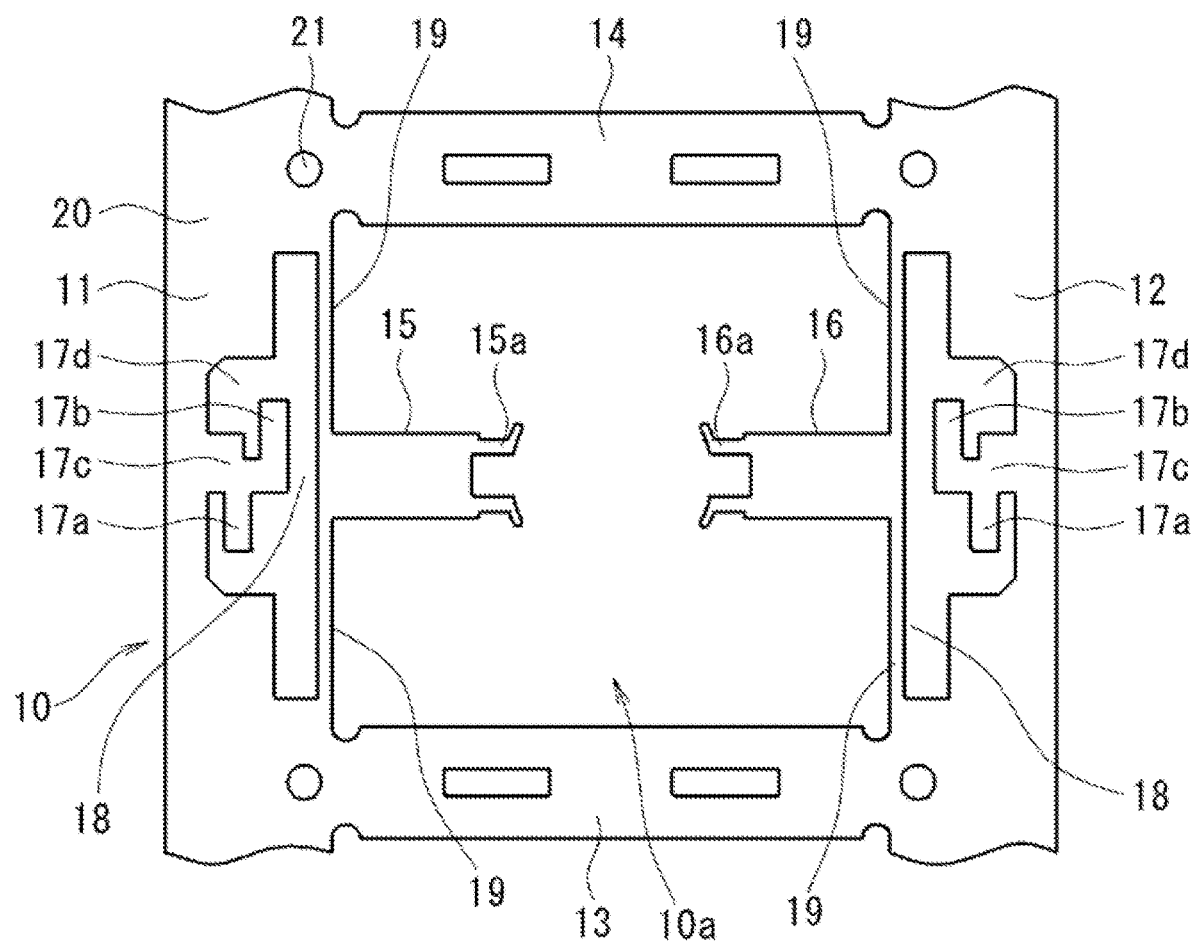
FIG. 1 is a plan view that shows a terminal plate member of a coil component according to a first embodiment of the present invention.

As discussed below, embodiments according to the present invention are explained with reference to the drawings.

In regards to the drawings, redundant explanations with respect to the same configurations are omitted but the same reference numerals are used for labeling.

First Embodiment

First of all, a terminal plate member 100 of a coil component (simply, referred to as "a terminal plate member 100" below) according to a first embodiment of the present invention will be explained below with reference to the drawings such as FIG. 1. A terminal 32 of the coil component (for instance, a coil component 30 shown in FIG. 2A) is mounted on the terminal plate member 100 according to the present embodiment. The terminal plate member 100 is configured with an annular frame member 10 (a frame member 10) and a pair of extension members 15 and 16 that respectively extend from an inner periphery of the frame member 10 toward an inside of the frame member 10. The frame member 10 has an easily-deformable section (in the present embodiment, a slit 18 (a through hole/an elongated through hole)) in the vicinity of a base end of at least one extension member (in the present embodiment, both of the extension members 15 and 16). Specifically, the easily-deformable section (18) extends through an entire (width) area in a width direction of the extension member. The fact that the easily-deformable section extends through the entire area in the width direction of the extension member means that, at least, the easily-deformable section extends over a range from one end to the other end in the width direction of the extension member. A single easily-deformable section can extend through the entire area in the width direction of the extension member as in the present embodiment. Further, contrary to the present embodiment, an easily-deformable section that is configured with a plurality of easily-deformable sections can also cover the entire area in the width direction of the extension member. In the latter case, easily-deformable sections that are mutually adjacent to each other among the plurality of easily-deformable sections are located in positions different from each other in an extending direction of the extension member. Further, easily-deformable sections that are mutually adjacent to each other are located in order to be mutually overlapped with each other when viewed in the extending direction of the extension member. AN explanation in detail will be provided below.

The terminal plate member 100 is made of a thin plate member that is composed of a metallic material (such as copper) and that is excellent in conductivity, and is also referred to as a "hoop."

The frame member 10 is, for instance, formed in a rectangular frame (an annular rectangular). An opening 10a is formed in a center of the frame member 10. The frame member 10 is configured by including four edges (margins or sides) (a first edge 11, a second edge 12, a third edge 13 and a fourth edge 14) that, for instance, respectively linearly extend. The first edge 11 and the second edge 12 extend in parallel to each other, and the third edge 13 and the fourth edge 14 extend in parallel to each other. Further, the third edge 13 and the fourth edge 14 extend in a direction orthogonally crossed with (perpendicular to) the first edge 11 and the second edge 12. One end of the first edge 11 is connected to one end of the fourth edge 14, the other end of the fourth edge 14 is connected to one end of the second edge 12, the other end of the second edge 12 is connected to one end of the third edge 13, and the other end of the third edge 13 is connected to the other end of the first edge 11.

The extension member 15 extends from a center in the extending direction of the first edge 11 toward the second edge 12. Similarly, the extension member 16 extends from a center in the extending direction of the second edge 12 toward the first edge 11. Specifically, the extension members 15 and 16 extend in a direction orthogonally crossed with (perpendicular to) the first edge 11 and the second edge 12. The extension members 15 and 16 are, for instance, mutually located on the same straight line. A tip 15a of the extension member 15 and a tip 16a of the extension member 16 are, for instance, respectively formed into a bifurcated shape (having two branches).

In the present embodiment, a through hole (for instance, a slit 18) is respectively formed in the first edge 11 and the second edge 12 as the easily-deformable sections. That is, in the present embodiment, the easily-deformable sections corresponds to the through holes (the slits) 18 that are formed in the frame member 10.

For instance, the slit 18 linearly extends along a longitudinal direction of each of the first edge 11 and the second edge 12. In the present embodiment, the extension members 15 and 16 extend in the direction orthogonally crossed with (perpendicular to) the first edge 11 and the second edge 12. Therefore, the slits 18 extend in crossing directions (for instance, in the orthogonal directions) to the extending directions of the extension members 15 and 16. The slit 18 that is formed in the first edge 11, at least, extends through an entire area in a width direction of the extension member 15. Similarly, the slit 18 that is formed in the second edge 12, at least, extends through an entire area in a width direction of the extension member 16.

Specifically, the slit 18 that is formed in the first edge 11 is formed to be longer than the width of the extension member 15 and extends beyond the width of the extension member 15. For instance, one end of the slit 18 that is formed in the first edge 11 is located in the vicinity of an intersection of the first edge 11 and the fourth edge 14. The other end of the slit 18 is located in the vicinity of an intersection of the first edge 11 and the third edge 13. Similarly, the slit 18 that is formed in the second edge 12 is formed to be longer than the width of the extension member 16 and extends beyond the width of the extension member 16. For instance, one end of the slit 18 that is formed in the second edge 12 is located in the vicinity of an intersection of the second edge 12 and the fourth edge 14. The other end of the slit 18 is located in the vicinity of an intersection of the second edge 12 and the third edge 13. That is, the easily-deformable sections (the slits 18) extend beyond the widths of the extension members 15 and 16 in the crossing directions to the extending directions of the extension members 15 and 16.

Further, it is preferred that a length (a longitudinal dimension) of the slit 18 is 1.0-4.0 times of the width of each of the extension members 15 and 16. As explained above, the easily-deformable sections (in the present embodiment, the slits 18) are located in the vicinity of the base end of the extension members 15 and 16. As an example, it is preferred that a distance between the easily-deformable section and the base end of each of the extension members 15 and 16 is smaller than or equal to the width of each of the extension members 15 and 16.

The frame member 10 has an annular part 20 that includes a circumference edge of the frame member 10 and connection parts 19. That is, the frame member 10 has a pair of the connection parts 19 that extend along the slit 18 of the first edge 11 in an inside of the annular part 20 and mutually connect the base end of the extension member 15 and the annular part 20. Further, the frame member 10 has a pair of the connection parts 19 that extend along the slit 18 of the second edge 12 in the inside of the annular part 20 and mutually connect the base end of the extension member 16 and the annular part 20. The annular part 20 corresponds to an area that does not include the connection parts 19 with respect to the frame member 10.

Figure 2A:
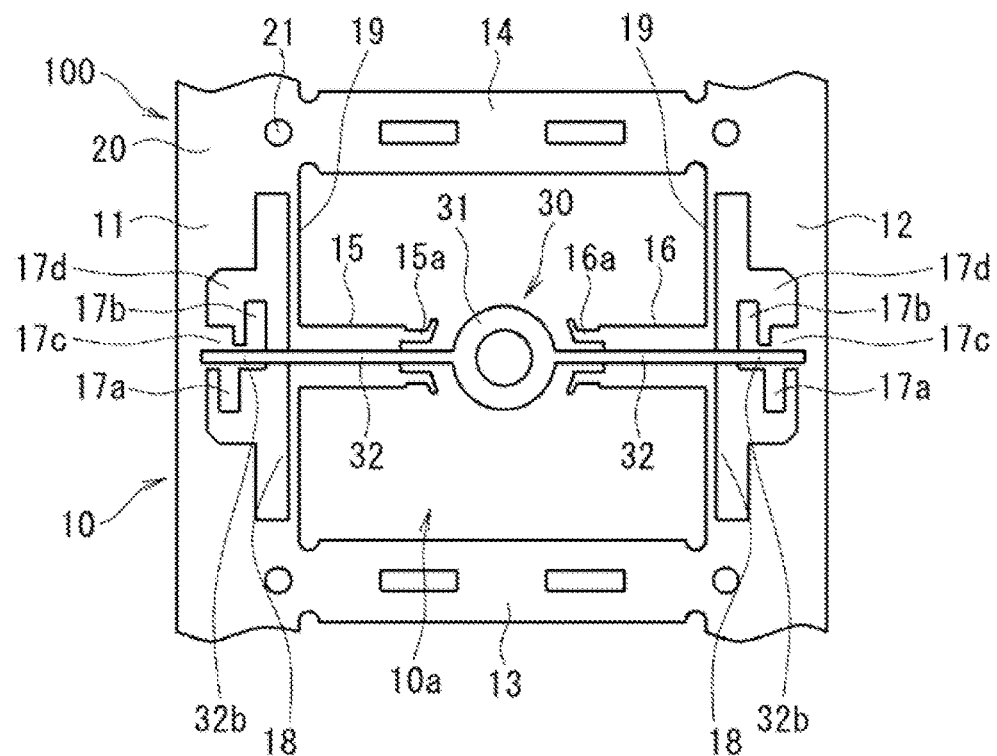
FIGS. 2A and 2B are plan views that show a series of processes of a method for manufacturing an electronic component according to the first embodiment of the present invention.
Figure 2B:
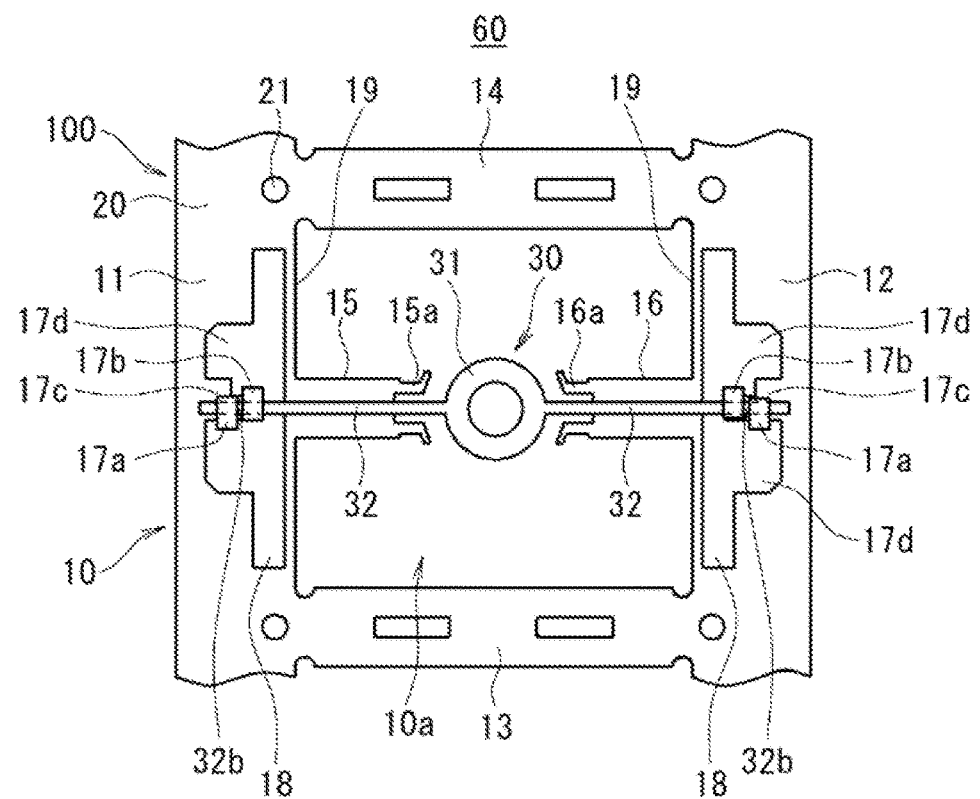

Further, the coil component 30 shown, for instance, in FIGS. 2A and 2B is mounted on the terminal plate member 100. The shape and configuration of the coil component 30 are schematically shown, for instance, in FIGS. 2A and 2B. The coil component 30 is configured by a conductive wire. That is, the coil component 30 is configured with a winding section 31 and a pair of (coil) terminals 32. Specifically, the winding section 31 is configured by winding the conductive wire. The pair of terminals 32 project from the winding section 31. When the coil component 30 is viewed in a direction of a winding axis of the winding section 31, the pair of terminals 32 respectively linearly project in opposite directions from the winding section 31.

Further, as shown, for instance, in FIGS. 2A and 2B, widths of the extension members 15 and 16 are wider than widths of the terminals 32.

The frame member 10 has a clamping holding member (a clamping holding member, a staking holding member or a fixing member) (for instance, clamping holding members 17a and 17b) that holds an end of the terminal 32 by clamping. Further, the easily-deformable sections (the slit 18) are located between the clamping holding members and the extension members 15 and 16. In the present embodiment, each of the first edge 11 and the second edge 12 has the clamping holding members 17a and 17b.

Specifically, a peripheral opening 17d being continuous to the slit 18 is formed adjacent to the slit 18 in the first edge 11. The peripheral opening 17d is located adjacent to the slit 18 on an opposite side with respect to the extension member 15. The first edge 11 has a support 17c that projects from an inner periphery of the peripheral opening 17d toward an inside of the peripheral opening 17d. The support 17c projects from a part on an opposite side with respect to the extension member 15 toward the extension member 15 at the inner periphery of the peripheral opening 17d. The clamping holding member 17a of the first edge 11 projects in one direction being parallel to the slit 18 from the support 17c of the first edge 11. The clamping holding member 17b of the first edge 11 projects in the other direction (an opposite direction to the one direction explained above) being parallel to the slit 18 from the support 17c of the first edge 11. The clamping holding members 17a and 17b of the first edge 11 are located next to each other in the extending direction of the extension member 15. A distance between the clamping holding member 17a and the extension member 15 is longer than a distance between the clamping holding member 17b and the extension member 15.

Similarly, the peripheral opening 17d being continuous to the slit 18 is formed adjacent to the slit 18 in the second edge 12. The peripheral opening 17d is located adjacent to the slit 18 on an opposite side with respect to the extension member 16. The second edge 12 has the support 17c that projects from an inner periphery of the peripheral opening 17d toward an inside of the peripheral opening 17d. The support 17c projects from a part on an opposite side with respect to the extension member 16 toward the extension member 16 at the inner periphery of the peripheral opening 17d. The clamping holding member 17a of the second edge 12 projects in one direction being parallel to the slit 18 from the support 17c of the second edge 12. The clamping holding member 17b of the second edge 12 projects in the other direction (an opposite direction to the one direction explained above) being parallel to the slit 18 from the support 17c of the second edge 12. The clamping holding members 17a and 17b of the second edge 12 are located next to each other in the extending direction of the extension member 16. A distance between the clamping holding member 17a and the extension member 16 is longer than a distance between the clamping holding member 17b and the extension member 16.

However, the present invention is not limited to the above embodiment. The easily-deformable section (in the present embodiment, the slit 18) can also be located at, for example, a farther location than the clamping holding members (the clamping holding members 17a and 17b) with respect to the extension members 15 and 16. That is, in FIG. 1, the left side easily-deformable section (the slit 18) can be located on a farther left side with respect to the left side clamping holding members 17a and 17b, and the right side easily-deformable section (the slit 18) can also be located on a farther right side with respect to the right side clamping holding members 17a and 17b.

The frame member 10 has a positioning hole(s) 21 being used for positioning of the terminal plate member 100 relative to another member. That is, the frame member 10 has the slits 18 corresponding to the easily-deformable sections in addition to the positioning hole(s) 21. The shape, number, and location of the positioning hole(s) 21 are not particularly limited, however, as an example, each of the positioning holes 21 have a circular shape. Further, the positioning holes 21 are located at four locations in total, an intersection of the first edge 11 and the fourth edge 14, an intersection of the fourth edge 14 and the second edge 12, an intersection of the second edge 12 and the third edge 13, and an intersection of the third edge 13 and the first edge 11.

Next, a method for manufacturing an electric component according to an embodiment of the present invention will be explained below. The manufacturing method has the following processes (i)-(v) explained below.

(i) Preparation Process of the terminal plate member 100 of the coil component according to the present embodiment.

(ii) Preparation Process of the coil component 30 that is configured by the conductive wire as the coil component. As explained above, the coil component 30 is configured with the winding section 31 that is configured by winding the conductive wire and the pair of terminals 32 that project from the winding section 31.

(iii) Manufacturing Process in which each of the terminals 32 of the coil component 30 is located at each of the extension members 15 and 16 of the terminal plate member 100 so that the coil component 30 and the terminal plate member 100 are mutually assembled (combined), and a semifinished (unfinished) product 60 is manufactured (FIGS. 2A and 2B).

Figure 3:
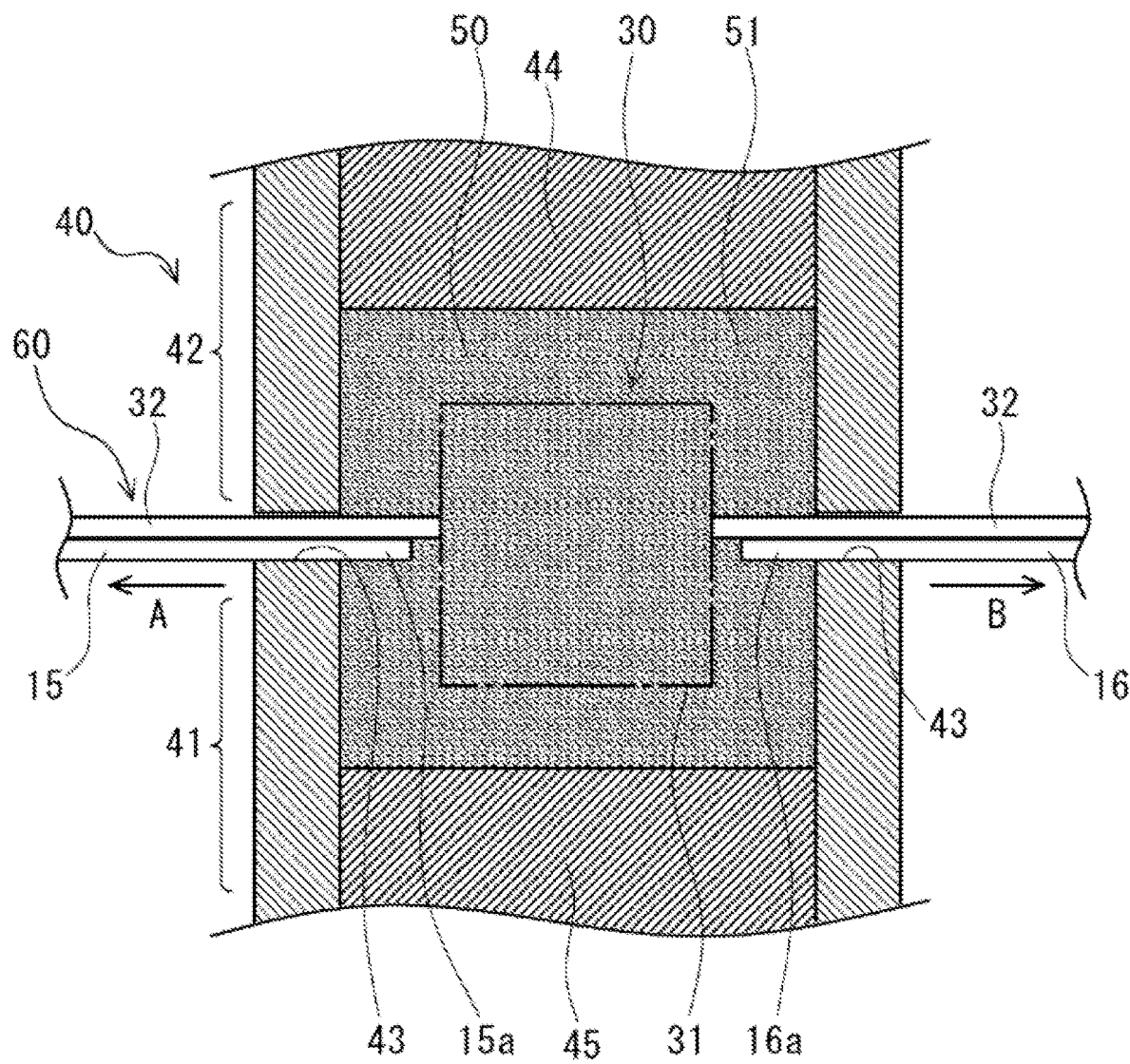
FIG. 3 is a front cross sectional view that shows the series of processes of the method for manufacturing the electronic component according to the first embodiment of the present invention.

(iv) Covering (Filling) Process in which the semifinished product 60 is placed in a mold 40 and the semifinished product 60 is covered by magnetic powder 51 (FIG. 3).

(v) Pressurizing (Pressing) Process in which a magnetic core 50 (FIGS. 4, 5A and 5B) is formed by pressurizing the magnetic powder 51 (FIG. 3).

Figure 4:
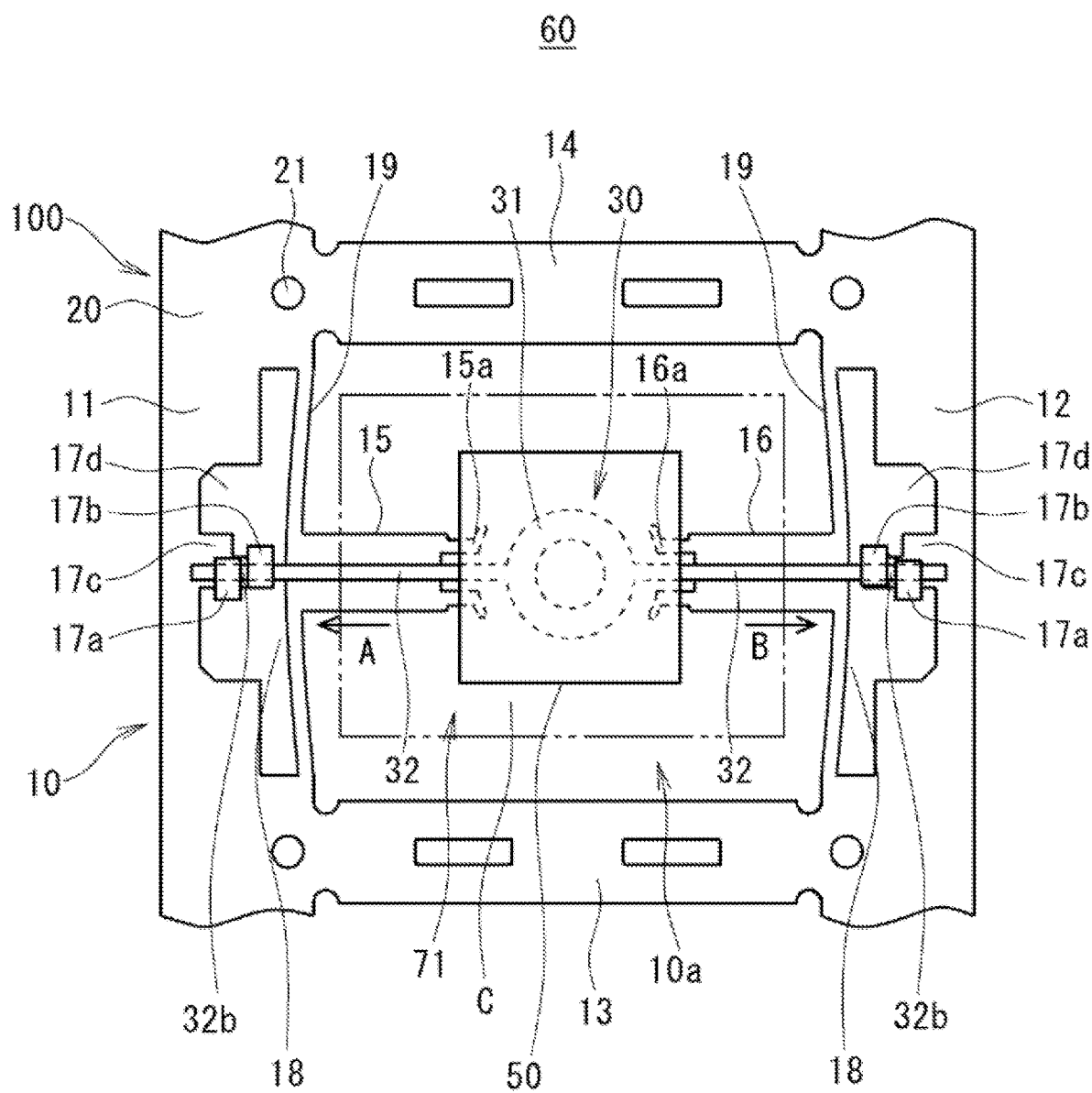
FIG. 4 is a plan view that shows the series of processes of the method for manufacturing the electronic component according to the first embodiment of the present invention.

Further, by using the Pressurizing (Pressing) Process, because the extension members 15 and 16 are displaced in an extending direction of the terminals 32, the displacement is absorbed by the easily-deformable sections (refer to FIG. 4). The explanation in detail will be provided below.

After the terminal plate member 100 and the coil component 30 are prepared, as shown in FIG. 2A, one of the terminals 32 of the coil component 30 is placed on the extension member 15, and at the same time, the other of the terminals 32 is placed on the extension member 16. Further, as discussed above, when the coil component 30 is positioned with respect to the terminal plate member 100, the terminal plate member 100 can also be positioned (aligned) by using the positioning hole 21. Further, the tip (a clamped member 32b, i.e., a member which is clamped to another member) of one of the terminals 32 is located on the support 17c of the first edge 11. The tip (a clamped member 32b, i.e., a member which is clamped to another member) of the other of the terminals 32 is located on the support 17c of the second edge 12. Further, the winding section 31 of the coil component 30 is located between the tip of the extension member 15 and the tip of the extension member 16 in a plan view.

Next, as shown in FIG. 2B, by clamping the clamping holding members 17a and 17b of the first edge 11, the clamped member 32b of one of the terminals 32 can be held by the support 17c, and at the same time, by clamping the clamping holding members 17a and 17b of the second edge 12, the clamped member 32b of the other of the terminals 32 can be held by the support 17c. As explained above, because each of the terminals 32 of the coil component 30 is placed on each of the extension members 15 and 16 of the terminal plate member 100, the coil component 30 and the terminal plate member 100 are assembled to each other (mutually combined). As a result, the semifinished product 60 shown in FIG. 2B can be obtained.

Next, as shown in FIG. 3, the semifinished product 60 is placed in a mold 40. The mold 40 is, for instance, configured with a first die member 41 and a second die member 42 that are respectively formed in a rectangular frame shape and are opened in up or down directions. Further, the mold 40 is configured by assembling the first die member 41 and the second die member 42 to each other. In addition, a third die member 44 and a fourth die member 45 are provided in the mold 40. A press apparatus is configured with the mold 40, the third die member 44 and the fourth die member 45. The mold 40 has a pair of insertion holes 43. One of the insertion holes 43 makes one of the terminals 32 outwardly project from an interior space to an outer space of the mold 40, and at the same time, inserts the tip 15a of the extension member 15 inside of the mold 40. Further, the other of the insertion holes 43 makes the other of the terminals 32 outwardly project from the interior space to the outer space of the mold 40, and at the same time, inserts the tip 16a of the extension member 16 inside of the mold 40.

As shown in FIG. 3, first of all, the winding section 31 of the coil component 30 is placed in the interior space of the mold 40, and the pair of terminals 32 are projected to the outside of the mold 40 through the insertion holes 43. In this state, the tips 15a and 16a of the extension members 15 and 16 are located in the interior space of the mold 40. Next, the magnetic powder 51 is filled inside of the mold 40. As a result, the winding section 31 of the coil component 30, the base end of each of the terminals 32, and the tips 15a and 16a of each of the extension members 15 and 16 are embedded in the magnetic powder 51. That is, the semifinished product 60 is covered by the magnetic powder 51 (a part of the semifinished product 60 is covered) (Covering (Filing) Process).

Next, the magnetic core 50 is formed around the winding section 31 by pressurizing the magnetic powder 51 by the third die member 44 and the fourth die member 45 in the mold 40 (Pressurizing (Pressing) Process). After the Pressurizing (Pressing) Process, the third die member 44 and the fourth die member 45 are vertically separated from the magnetic core 50 and the semifinished product 60 is removed from the mold 40.

Further, in the Pressurizing (Pressing) Process, the extension members 15 and 16 are displaced by being extruded in the extending direction of the terminal 32 (the arrow A direction and the arrow B direction in FIGS. 3 and 4). However, the displacement is absorbed by the slit 18 corresponding to the easily-deformable section. In other words, as shown in FIG. 4, although each of the extension members 15 and 16 is displaced in the direction away from the winding section 31 (in the direction away from the magnetic core 50), the displacement is absorbed by the deformation of each of the connection parts 19 (refer to FIG. 4). As a result, strain (deformation/displacement of the terminal plate member 100) occurred in the terminal plate member 100 can be suppressed. Therefore, in regards to the magnetic core 50, a stress that is locally applied to the portions in which the extension members 15 and 16, and the terminals 32 project can be suppressed. Further, an occurrence of a crack in the magnetic core 50 can also be suppressed. Note that the arrow A direction and the arrow B direction are opposite to each other.

Thus, the method for manufacturing the electronic component according to the present embodiment can also be defined as explained below. That is, the method for manufacturing the electronic component according to the present embodiment includes: the preparation process of the terminal plate member 100 for the coil component; the preparation process of the coil component 30 that is configured by winding the conductive wire as the coil component, and is configured with the winding section 31 that is formed by winding the conductive wire and the pair of terminals 32 that project from the winding section 31; the manufacturing process in which because each of the terminals 32 of the coil component 30 is placed on each of the extension members 15 and 16 of the terminal plate member 100, the coil component 30 and the terminal plate member 100 are assembled to each other (mutually combined) so that the semifinished product 60 is manufactured; the covering (filling) process in which the semifinished product 60 is placed in the mold 40 and the semifinished product 60 is covered by the magnetic powder 51; and the pressurizing (pressing) process in which the magnetic core 50 is formed by pressurizing the magnetic powder 51. In the pressurizing (pressing) process, although the extension members 15 and 16 are displaced in the extending direction of the extension members 15 and 16, the displacement is absorbed by the easily-deformable sections (the slits 18).

Figure 5A:
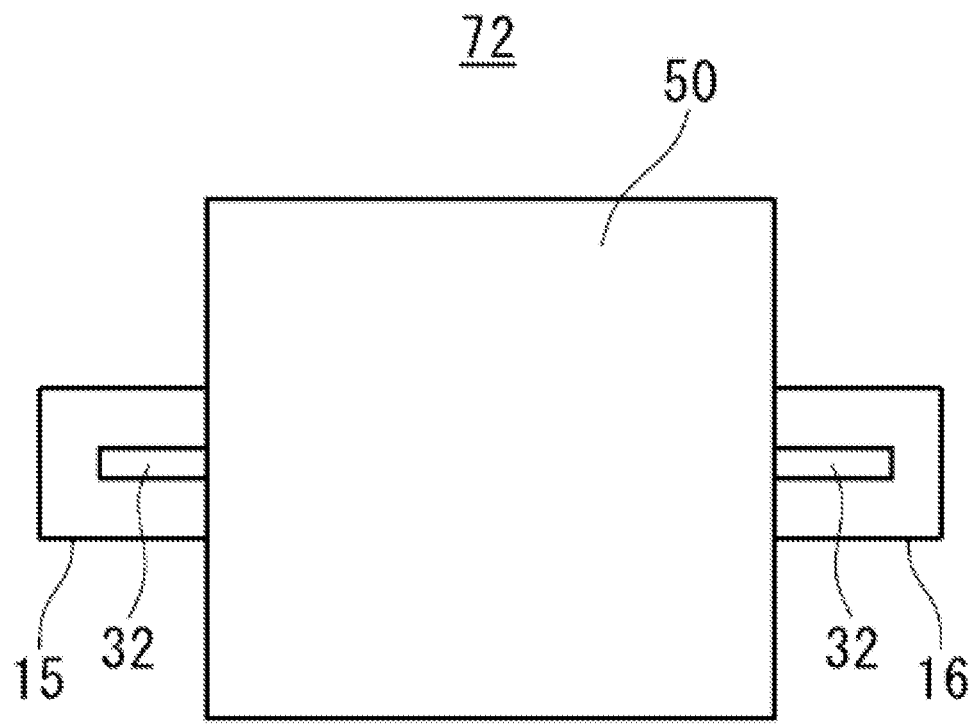
FIGS. 5A and 5B are plan views that show the series of processes of the method for manufacturing the electronic component according to the first embodiment of the present invention.

After the semifinished product 60 is removed from the mold 40, as shown in FIG. 5A, each of the terminals 32 and the extension members 15 and 16 are cut so that an individual piece 72 is obtained from the semifinished product 60. Further, in regards to the semifinished product 60, an electronic component configuration member 71 that is a part in a region C shown in FIG. 4 corresponds to the individual piece 72.

Figure 5B:
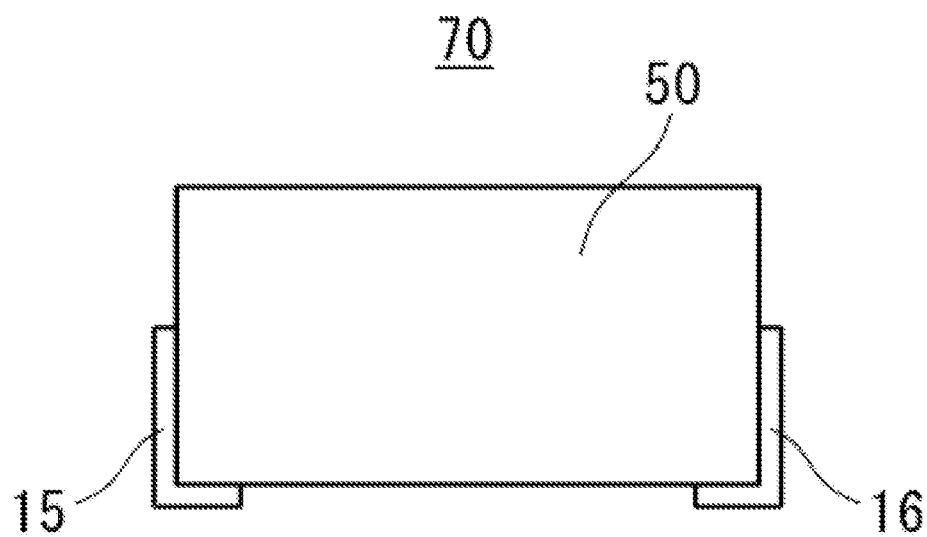

Further, as shown in FIG. 5B, the extension member 15 and one of the terminals 32 are bent along the outer surface of the magnetic core 50, and at the same time, the extension member 16 and the other of the terminals 32 are bent along the outer surface of the magnetic core 50. As a result, the electronic component 70 can be obtained.

According to the first embodiment of the present invention explained above, the frame member 10 of the terminal plate member 100 has the slit(s) 18 that corresponds to the easily-deformable section and that extends along the entire area in the width direction of the extension member in the vicinity of the base end of at least one of the extension members 15 and 16. Therefore, when the magnetic core 50 is formed by pressurizing the magnetic powder 51 that covers the coil component 30, the extension members 15 and 16 are displaced in the extending directions of the terminals 32. However, because the deformation/displacement can be absorbed by the easily-deformable section(s) (the slit(s) 18), the deformation/displacement (the strain) of the terminal plate member 100 can be suppressed. As a result, in regards to the magnetic core 50, the stress that is locally applied to the portions in which the extension members 15 and 16, and the terminals 32 project can be suppressed so that the occurrence of the crack in the magnetic core 50 can also be suppressed.

Further, because the easily-deformable sections (the slits 18) extend beyond the widths of the extension members 15 and 16 in the directions perpendicular to the extending directions of the extension members 15 and 16, relatively larger displacement of the extension members 15 and 16 can be absorbed by the easily-deformable sections.

Second Embodiment

Next, a second embodiment of the present invention will be explained with reference to FIGS. 6A and 6B below. A terminal plate member 100 according to the second embodiment is different from the terminal plate member 100 according to the first embodiment explained above with respect to features that are explanation below. However, other features thereof are configured in the same way as the terminal plate member 100 according to the first embodiment.

Figure 6A:
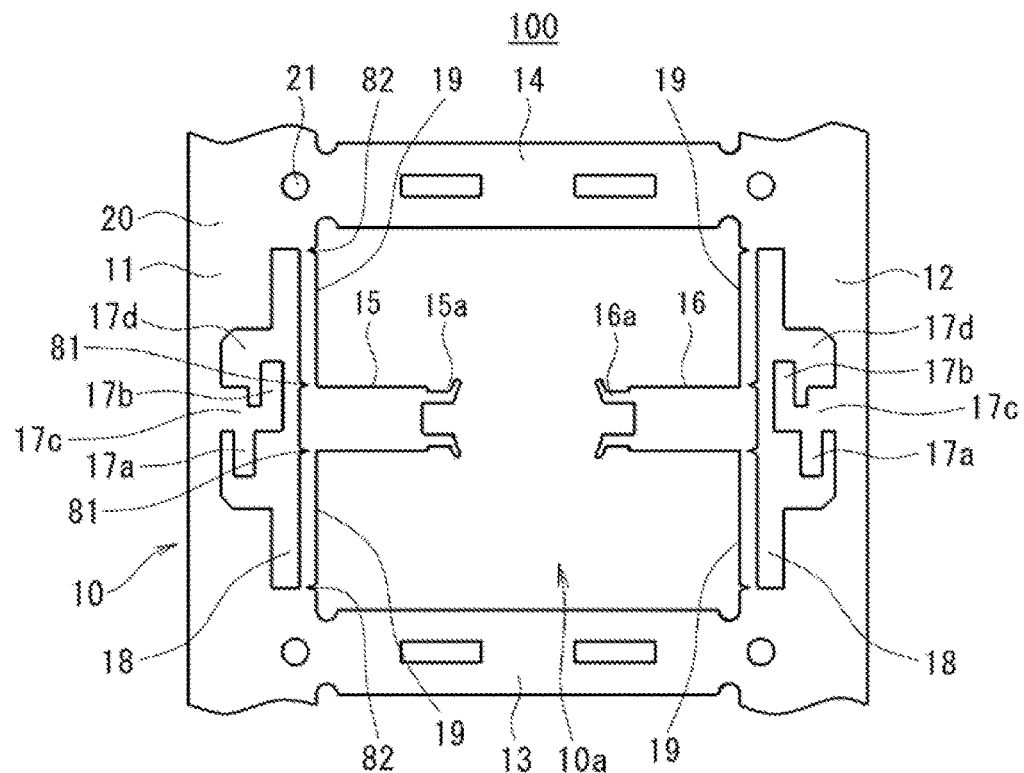
FIGS. 6A and 6B are plan views that show a series of processes of a method for manufacturing an electronic component according to a second embodiment of the present invention.
Figure 6B:
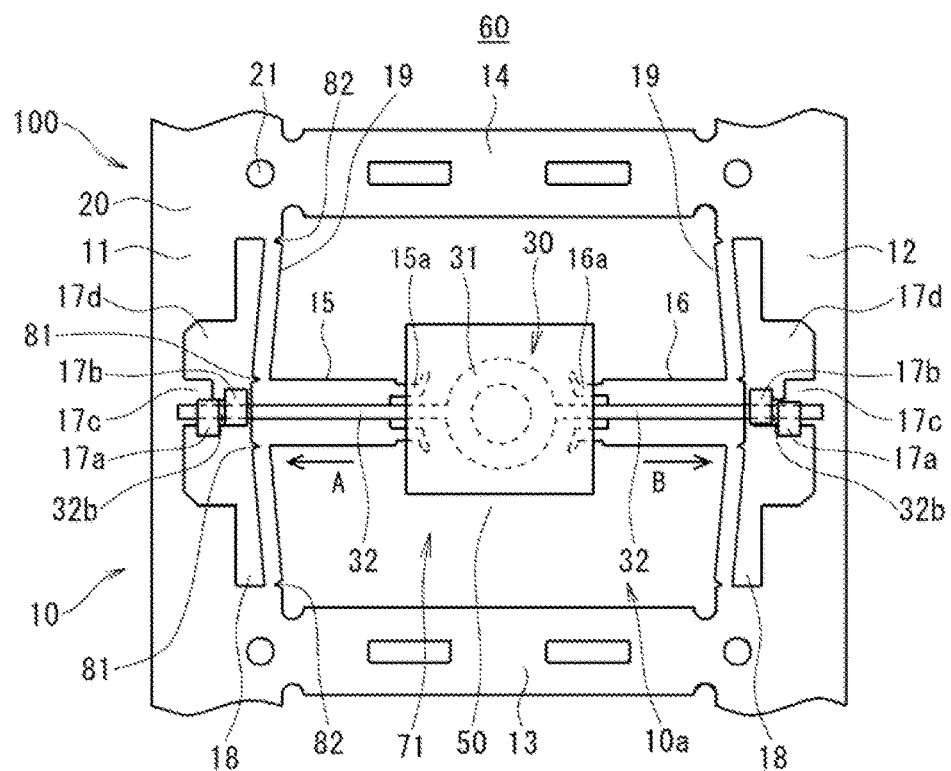

As shown in FIG. 6A, also in the same manner as the first embodiment, the easily-deformable sections correspond to the slits 18 that extend in crossing directions (for instance, in the orthogonal directions) to the extending directions of the extension members 15 and 16. The frame member 10 is configured with the annular part 20 that includes the circumference edge of the frame member 10 and a pair of connection parts 19. Specifically, the pair of connection parts 19 extend along the slits 18 in an inside of the annular part 20 and mutually connect the base ends of the extension members 15 and 16, and the annular part 20. Further, the frame member 10 has the pair of connection parts 19 in each of the extension members 15 and 16. In addition, each of the pair of connection parts 19 has a first notch 81 that is formed adjacent to the base ends of the extension members 15 and 16 in each of the connection part 19 and a second notch 82 that is formed adjacent to the ends of the connection parts 19 on the side of the annular part 20. As a result, the frame member 10 can be easily bent at the ends of each of the connection parts 19 (refer to FIG. 6B) because the first and second notches 81 and 82 are provided.

Specifically, the first notch 81 faces the slit 18, and the second notch 82 faces the opening 10a. As a result, the frame member 10 can be more easily bent at the ends of each of the connection parts 19.

Therefore, also in the present embodiment, when the magnetic core 50 is formed by pressurizing the magnetic powder 51 that covers the coil component 30, the extension members 15 and 16 are displaced in the extending directions of the terminals 32. However, because the deformation/displacement can be absorbed by the easily-deformable sections (the slits 18), the deformation/displacement (the strain) of the terminal plate member 100 can be suppressed.

Third Embodiment

Next, a third embodiment of the present invention will be explained with reference to FIG. 7 below. A terminal plate member 100 according to the third embodiment is different from the terminal plate member 100 according to the first embodiment explained above with respect to features that are explanation below. However, other features thereof are configured in the same way as the terminal plate member 100 according to the first embodiment.

Figure 7:
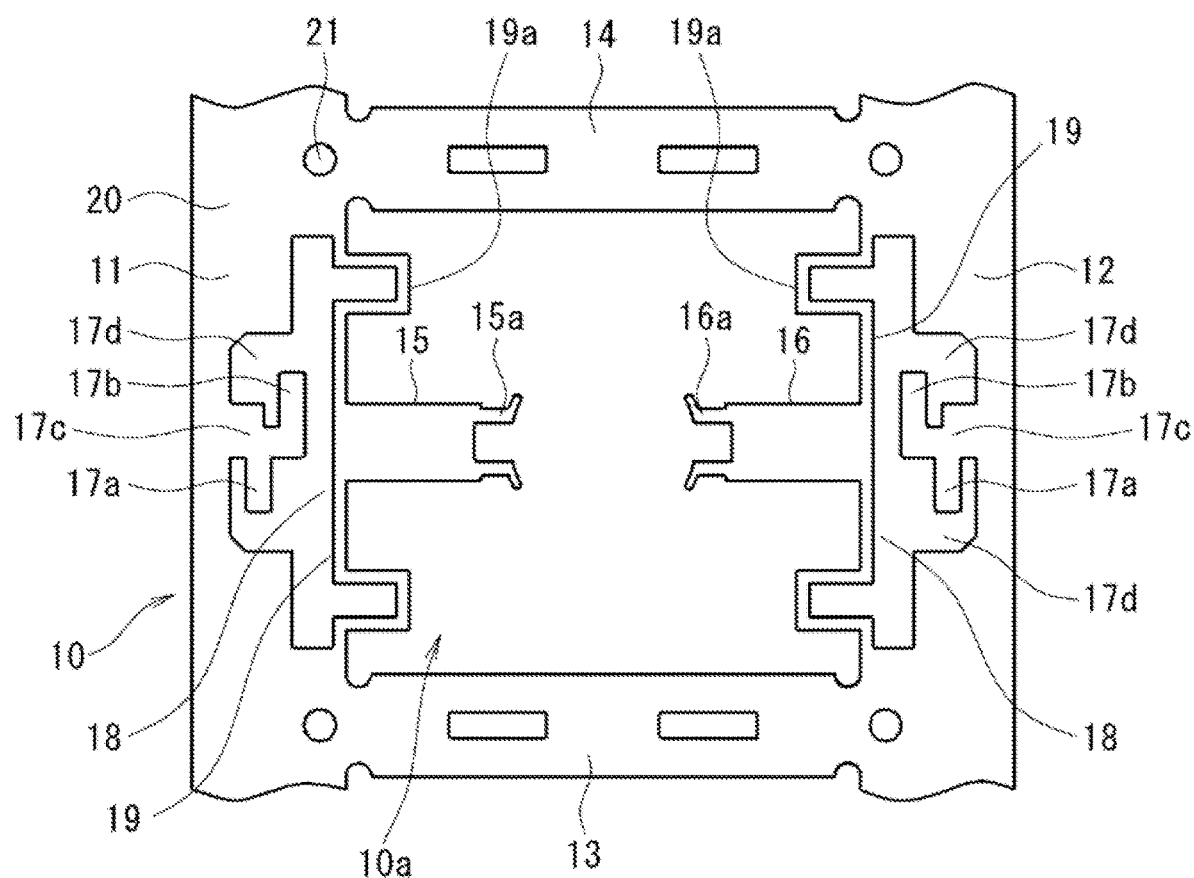
FIG. 7 is a plan view that shows a terminal plate member of a coil component according to a third embodiment of the present invention.

As shown in FIG. 7, in the third embodiment, each of the connection parts 19 is configured by including a meander shape part 19a that is in a meander (tortuosity) shape. As a result, flexibility of the connection parts 19 is improved. Therefore, also in the present embodiment, when the magnetic core 50 is formed by pressurizing the magnetic powder 51 that covers the coil component 30, the extension members 15 and 16 are displaced in the extending directions of the terminals 32. However, because the deformation/displacement can be absorbed by the easily-deformable sections (the slits 18), the deformation/displacement (the strain) of the terminal plate member 100 can be suppressed.

Fourth Embodiment

Next, a fourth embodiment of the present invention will be explained with reference to FIG. 8 below. A terminal plate member 100 according to the fourth embodiment is different from the terminal plate member 100 according to the first embodiment explained above with respect to features that are explanation below. However, other features thereof are configured in the same way as the terminal plate member 100 according to the first embodiment.

Figure 8:
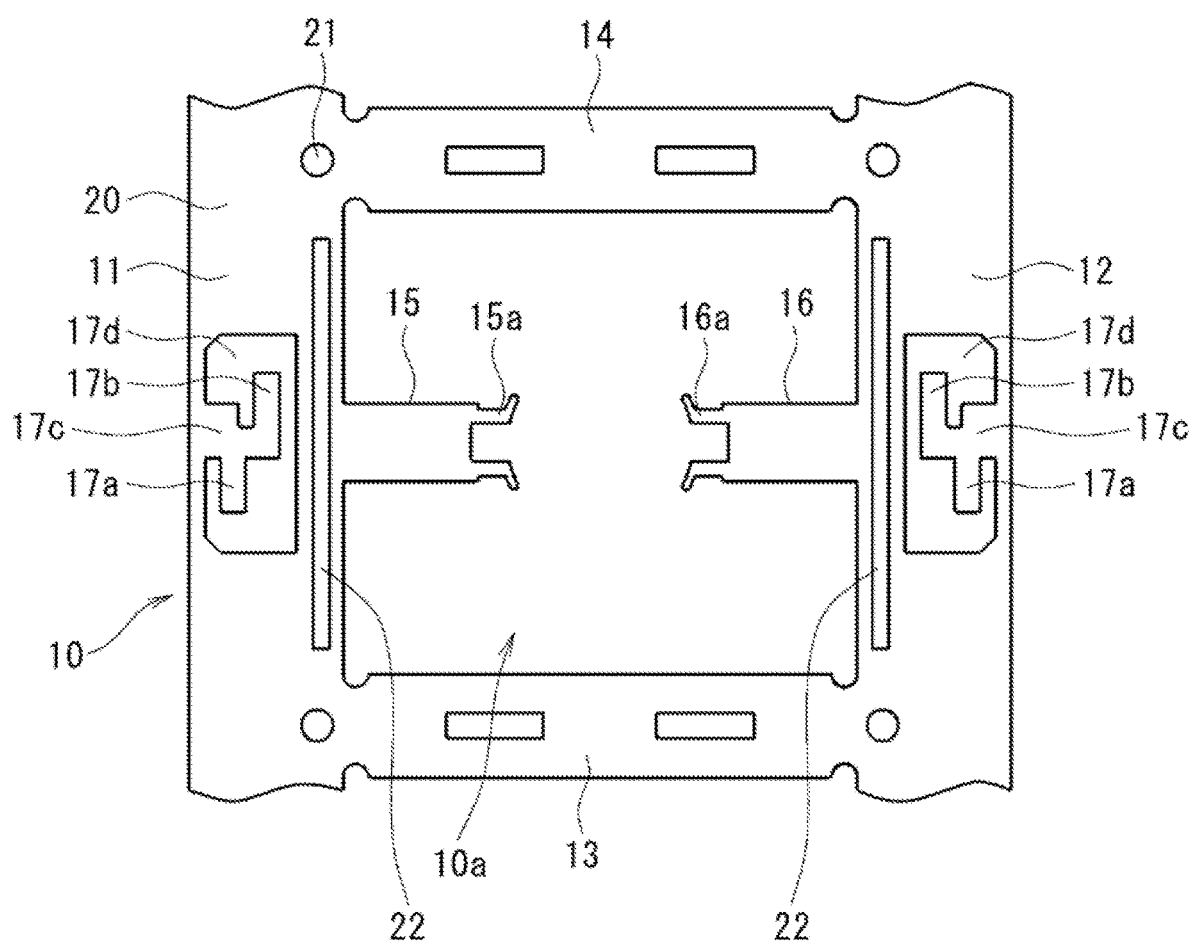
FIG. 8 is a plan view that shows a terminal plate member of a coil component according to a fourth embodiment of the present invention.

As shown in FIG. 8, in the fourth embodiment, the slits 18 (for example, shown in FIG. 1) are not formed in the first edge 11 and the second edge 12 of the frame member 10. Instead, a thin plate part 22 is respectively formed in the first edge 11 and the second edge 12 as the easily-deformable sections. That is, in the fourth embodiment, the easily-deformable sections correspond to the thin plate parts 22 that are formed in the frame member 10. A thickness of the thin plate part 22 is formed to be thinner as compared with a thickness of a regular frame member located at an area around the thin plate part 22 in the frame member 10. In other words, a recess is formed on surfaces of the frame member 10. The recess corresponds to the thin plate part 22 and corresponds to the easily-deformable section. The thin plate part 22 can be formed, for instance, by a half-etching method with respect to the surfaces of the frame member 10.

For instance, the thin plate part 22 linearly extends along a longitudinal direction of each of the first edge 11 and the second edge 12. In the present embodiment, the extension members 15 and 16 extend in directions orthogonally crossed with the first edge 11 and the second edge 12. Therefore, the thin plate part 22 extends in directions perpendicular to (for instance, in the orthogonal directions with respect to) the extending directions of the extension members 15 and 16.

The thin plate part 22 that is formed in the first edge 11 extends at least through an entire area in the width direction of the extension member 15. Similarly, the thin plate part 22 that is formed in the second edge 12 extends at least through an entire area in the width direction of the extension member 16.

Specifically, the thin plate part 22 that is formed in the first edge 11 is formed to be longer than the width of the extension member 15 and extends beyond the width of the extension member 15. For instance, one end of the thin plate part 22 that is formed in the first edge 11 is located in the vicinity of an intersection of the first edge 11 and the fourth edge 14. The other end of the thin plate part 22 is located in the vicinity of an intersection of the first edge 11 and the third edge 13. Similarly, the thin plate part 22 that is formed in the second edge 12 is formed to be longer than the width of the extension member 16 and extends beyond the width of the extension member 16. For instance, one end of the thin plate part 22 that is formed in the second edge 12 is located in the vicinity of an intersection of the second edge 12 and the fourth edge 14. The other end of the thin plate part 22 is located in the vicinity of an intersection of the second edge 12 and the third edge 13. That is, the easily-deformable sections (the thin plate parts 22) extend beyond the widths of the extension members 15 and 16 in the crossing directions to the extending directions of the extension members 15 and 16.

Also in the present embodiment, when the magnetic core 50 is formed by pressurizing the magnetic powder 51 that covers the coil component 30, the extension members 15 and 16 are displaced in the extending directions of the terminals 32. However, because the deformation/displacement can be absorbed by the easily-deformable sections (the thin plate parts 22), the deformation/displacement (the strain) of the terminal plate member 100 can be suppressed.

Fifth Embodiment

Next, a fifth embodiment of the present invention will be explained with reference to FIGS. 9A-15C below. A terminal plate member 100 according to the fifth embodiment is different from the terminal plate member 100 according to the first embodiment explained above with respect to features that are explanation below. However, other features thereof are configured in the same way as the terminal plate member 100 according to the first embodiment.

Figures 9A, 9B:
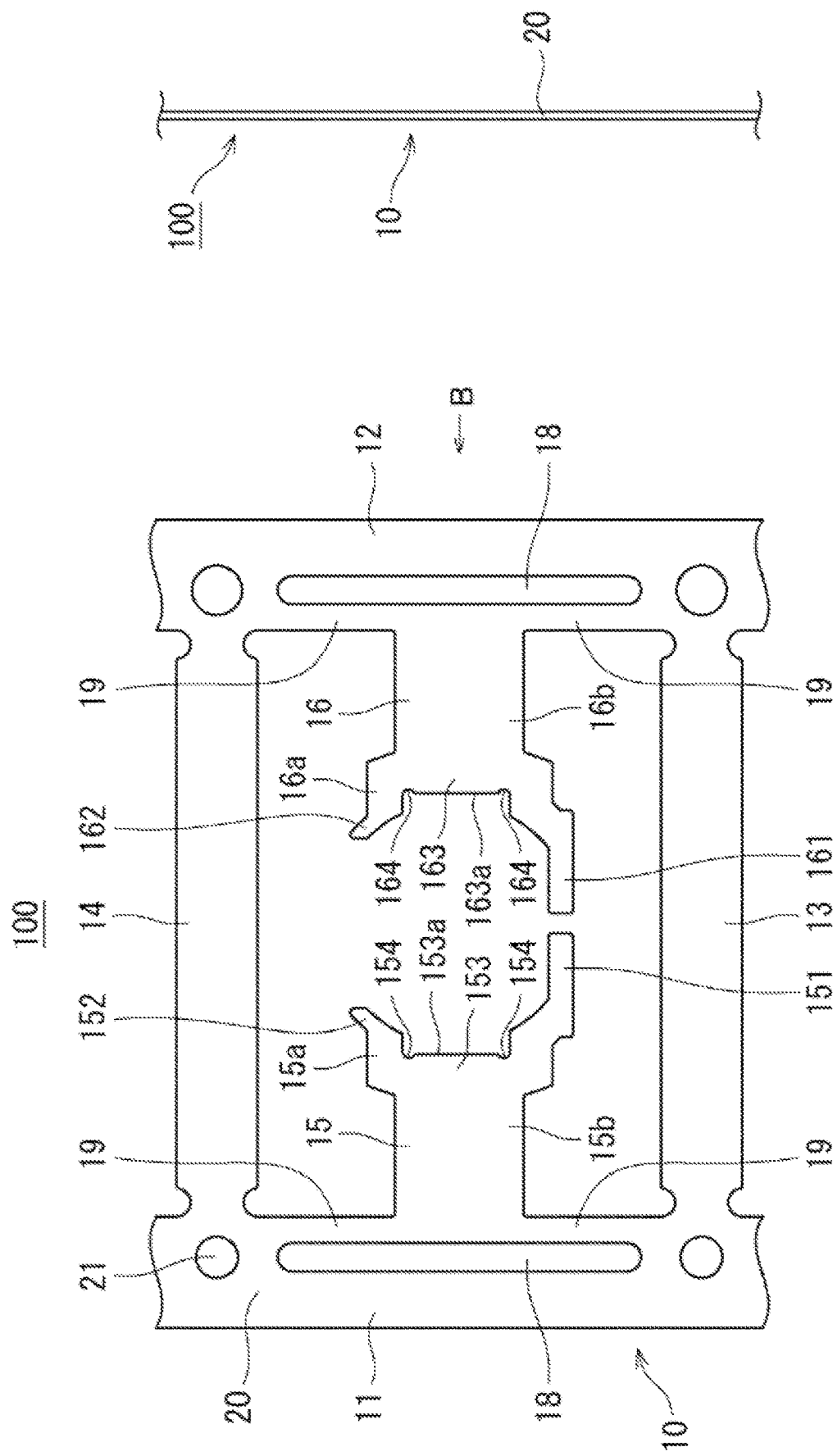
FIGS. 9A and 9B are views that show the terminal plate member according to the second embodiment of the present invention. Specifically.

FIGS. 9A and 9B show a state in which an entire terminal plate member 100 is flat. In other words, as explained below, second clamping holding members 151 and 161 respectively are bent in a later process (for instance, refer to FIGS. 10A, 10B and 10C). However, FIGS. 9A and 9B show a state before the second clamping holding members 151 and 161 are bent.

As shown in FIGS. 9A and 9B, also in the same manner as other embodiments with respect to the terminal plate member 100 in the fifth embodiment, the tip 15a of the extension member 15 and the tip 16a of the extension member 16 are, for instance, respectively formed into bifurcated shapes (having two branches). That is, each of the tips 15a and 16a of the pair of extension members 15 and 16 is formed into the bifurcated shape having a pair of branched portions.

Figure 15A:
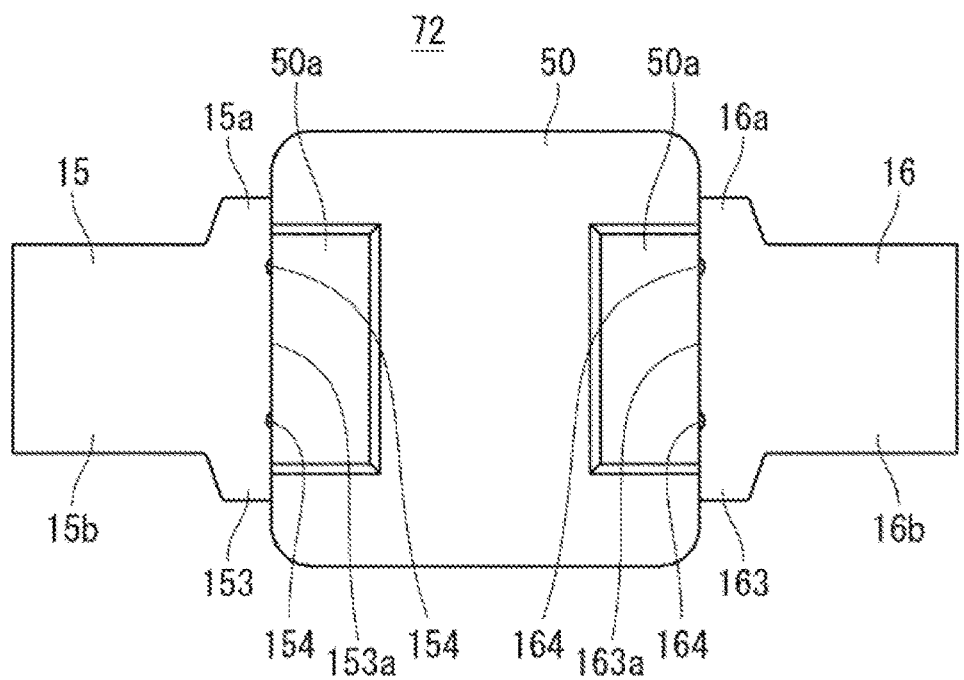
FIGS. 15A, 15B and 15C are views that show a method for manufacturing an electronic component by using the terminal plate member according to the second embodiment of the present invention. Specifically.
Figure 15B:
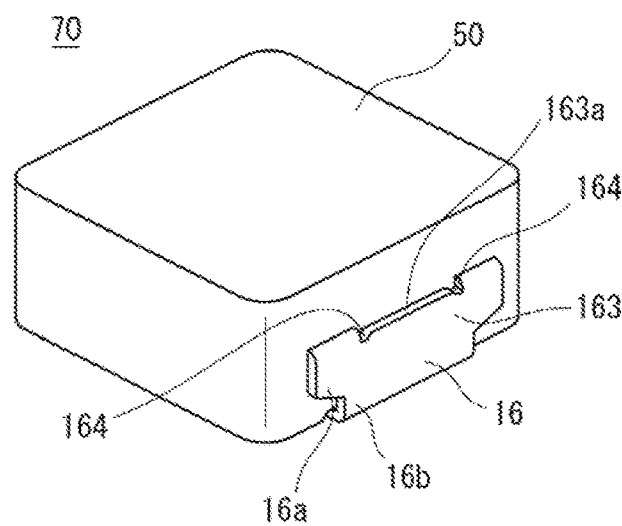
Figure 15C:
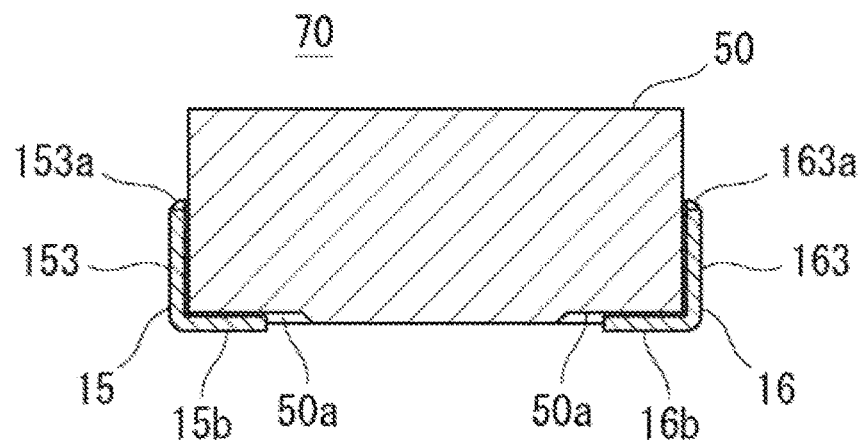

One of the pair of branched portions of the tip 15a of the extension member 15 corresponds to the second clamping holding member 151, and the other of the pair of branched portions of the tip 15a of the extension member 15 corresponds to an anchor part 152. The second clamping holding member 151 holds one of the terminals 32 of the coil component 30 by clamping (refer to FIGS. 12A and 12C). Further, the second clamping holding member 151 and the anchor part 152 are respectively embedded in the magnetic core 50 and perform the anchor function that prevents the extension member 15 from detaching from the magnetic core 50. This extension member 15 is in a state in which the extension member 15 has been cut (FIGS. 15A and 15C).

Similarly, one of the pair of branched portions of the tip 16a of the extension member 16 corresponds to the second clamping holding member 161, and the other of the pair of branched portions of the tip 16a of the extension member 16 corresponds to an anchor part 162. The second clamping holding member 161 holds the other of the terminals 32 of the coil component 30 by clamping (refer to FIGS. 12A-12C). Further, the second clamping holding member 161 and the anchor part 162 are respectively embedded in the magnetic core 50 and perform the anchor function that prevents the extension member 16 from detaching from the magnetic core 50. This extension member 16 is in a state in which the extension member 16 has been cut (FIGS. 15A-15C).

Further, the part other than the tip 15a of the extension member 15 is referred to as a base end 15b. Similarly, the part other than the tip 16a of the extension member 16 is referred to as a base end 16b.

Further, in the present embodiment, the tip 15a is configured with a tip base section 153 and the pair of branched portions (the second clamping holding member 151 and the anchor part 152). The tip base section 153 is continuously provided at a tip side of the base end 15b. The pair of branched portions (the second clamping holding member 151 and the anchor part 152) project farther toward the tip side of the extension member 15 than the tip of the tip base section 153.

Similarly, in the present embodiment, the tip 16a is configured with a tip base section 163 and the pair of branched portions (the second clamping holding member 161 and the anchor part 162). The tip base section 163 is continuously provided at a tip side of the base end 16b. The pair of branched portions (the second clamping holding member 161 and the anchor part 162) project farther toward the tip side of the extension member 16 than the tip of the tip base section 163.

In the present embodiment, the tip base section 153 is, for instance, formed to be wider than the base end 15b, and extends to both sides in the width direction of the base end 15b from the tip of the base end 15b. Further, with respect to the tip base section 153, the second clamping holding member 151 projects from one of the parts that extends more than the base end 15b in the width direction, and the anchor part 152 projects from the other of the parts. Further, a projected length of the second clamping holding member 151 from the tip base section 153 is longer than a projected length of the anchor part 152 from the tip base section 153. The tip of the second clamping holding member 151 is, for instance, formed into a band shape with a predetermined width. This band-shaped part is, for instance, formed in a longitudinal dimension in a direction parallel to the extending direction of the extension member 15. This band is clamped and holds one of the terminals 32 in the second clamping holding member 151.

Similarly, in the present embodiment, the tip base section 163 is, for instance, formed to be wider than the base end 16b, and extends to both sides in the width direction of the base end 16b from the tip of the base end 16b. Further, with respect to the tip base section 163, the second clamping holding member 161 projects from one of the parts that extends more than the base end 16b in the width direction, and the anchor part 162 projects from the other of the parts. Further, a projected length of the second clamping holding member 161 from the tip base section 163 is longer than a projected length of the anchor part 162 from the tip base section 163. The tip of the second clamping holding member 161 is, for instance, formed into a band shape with a predetermined width. This band-shaped part is, for instance, formed in a longitudinal dimension in a direction parallel to the extending direction of the extension member 16. This band is clamped and holds the other of the terminals 32 in the second clamping holding member 161.

As explained above, each of the tips 15a and 16a of the pair of extension members 15 and 16 is formed into the bifurcated shape having the pair of branched portions. Further, at least one of the pair of branched portions configures each of the second clamping holding members 151 and 161 that hold the terminals 32 by clamping. In the present embodiment, one of the pair of branched portions corresponds to the second clamping holding members 151 or 161, and the other of the pair of branched portions corresponds to the anchor parts 152 or 162, not the second clamping holding members 151 or 161. However, according to the present invention, the above configuration is not limited to this and it is also possible that both the pair of branched portions can also correspond to the second clamping holding members 151 or 161.

An edge of the tip side of the tip base section 153 (referred to as "a base section tip edge 153a" below), for instance, extends linearly in a direction perpendicular to the extending direction of the extension member 15. For instance, an edge notch 154 is formed at both end sides of the base section tip edge 153a. One of the edge notches 154 is located adjacent to the base end of the second clamping holding member 151. The other of the edge notches 154 is located adjacent to the base end of the anchor part 152.

An edge of the tip side of the tip base section 163 (referred to as "a base section tip edge 163a" below), for instance, extends linearly in a direction perpendicular to the extending direction of the extension member 16. For instance, an edge notch 164 is formed at both end sides of the base section tip edge 163a. One of the edge notches 164 is located adjacent to the base end of the second clamping holding member 161. The other of the edge notches 164 is located adjacent to the base end of the anchor part 162.

The tip 15a of the extension member 15 and the tip 16a of the extension member 16 are located to face to each other. Specifically, the second clamping holding members 151 and 161 face to each other, and the anchor parts 152 and 162 face too each other. For instance, the extension members 15 and 16 are formed in linear symmetrical (being formed bisymmetrically in FIG. 9A). In this case, a line with respect to the linear symmetry is a center line extending in the extending direction of each of the extension members 15 and 16 with respect to the widths of each of the extension members 15 and 16.

Further, in the present embodiment, in each of the first edge 11 and the second edge 12, the clamping holding members 17a and 17b, the support 17c and the peripheral opening 17d are not formed. In other words, in each of the first edge 11 and the second edge 12, the straight slit 18 is formed. As a result, the configuration of the terminal plate member 100 can be simplified.

Further, in the first embodiment, the slits (for instance, the two slits each) are formed also in the third edge 13 and the fourth edge 14, for instance, in FIG. 1. However, in the present embodiment, for instance, the slit is not formed in the third edge 13 and the fourth edge 14. As a result, the configuration of the terminal plate member 100 can be more simplified. However, as necessary, in the same way as the first embodiment, a small slit can also be formed in the third edge 13 and the fourth edge 14.

Next, a method for manufacturing an electronic component 70 (FIGS. 15A and 15B) by using the terminal plate member 100 according to the present embodiment of the present invention will be explained below.

First, as shown in FIGS. 10A-10C, a band-shaped tip of each of the second clamping holding members 151 and 161 is bent. As a result, the band-shaped tip of each of the second clamping holding members 151 and 161 is in a raised state from the plane surface on which the frame member 10 exists. That is, in the states that FIGS. 10A-10C show, the second clamping holding members 151 and 161 of the terminal plate member 100 raise from the plane surface on which the frame member 10 exists. Further, with respect to the plane surface on which the frame member 10 exists, the second clamping holding members 151 and 161 are respectively raised to the same side (a lower side in FIG. 10C).

Further, also in the states in FIGS. 10A-10C, the part other than the tip of the second clamping holding member 151 of the extension member 15 and the part other than the tip of the second clamping holding member 161 of the extension member 16 are located in the plane surface on which the frame member 10 exists.

Next, one of the terminals 32 of the coil component 30 is hooked by the second clamping holding member 151 and the other of the terminals 32 is hooked by the second clamping holding member 161. In this state, the coil component 30 is placed on the terminal plate member 100. Further, as shown in FIG. 11A, the pair of terminals 32 of the coil component 30 extend parallel to each other and in the same direction from the winding section 31 in the present embodiment. For instance, the coil component 30 is placed so that each of the terminals 32 extends in the direction perpendicular to the extending directions of the extension members 15 and 16.

Further, with respect to a space between the tips 15a and 16a in a plan view, the winding section 31 of the coil component 30 is located in the space and spaced apart from both tips 15a and 16a in the plan view. As explained above, with respect to each of the extension members 15 and 16, the tip base sections 153 and 163 are formed to be wider than the base ends 15b and 16b. Further, with respect to the tip base sections 153 and 163, the second clamping holding members 151, 161 and the anchor parts 152, 162 project from the positions of the tip base sections 153 and 163 that extend more than the base ends 15b and 16b in the width direction. Therefore, as compared with the first embodiment, even when the percentage of a flat dimension of the magnetic core 50 for a flat dimension of the winding section 31 is small, a clearance between the winding section 31, and the second clamping holding members 151, 161 and the anchor parts 152, 162 can be ensured. Further, it is preferred that the second clamping holding members 151, 161 and the anchor parts 152, 162 are respectively located at the four corners of the magnetic core 50 in a plan view (refer to FIG. 14A).

Figure 11B:
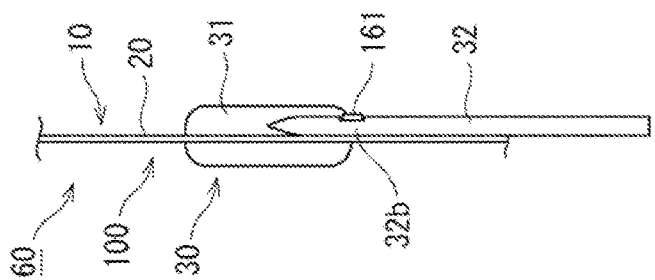
FIGS. 11A, 11B and 11C are views that show a method for manufacturing an electronic component by using the terminal plate member according to the second embodiment of the present invention. Specifically.
Figure 11A:
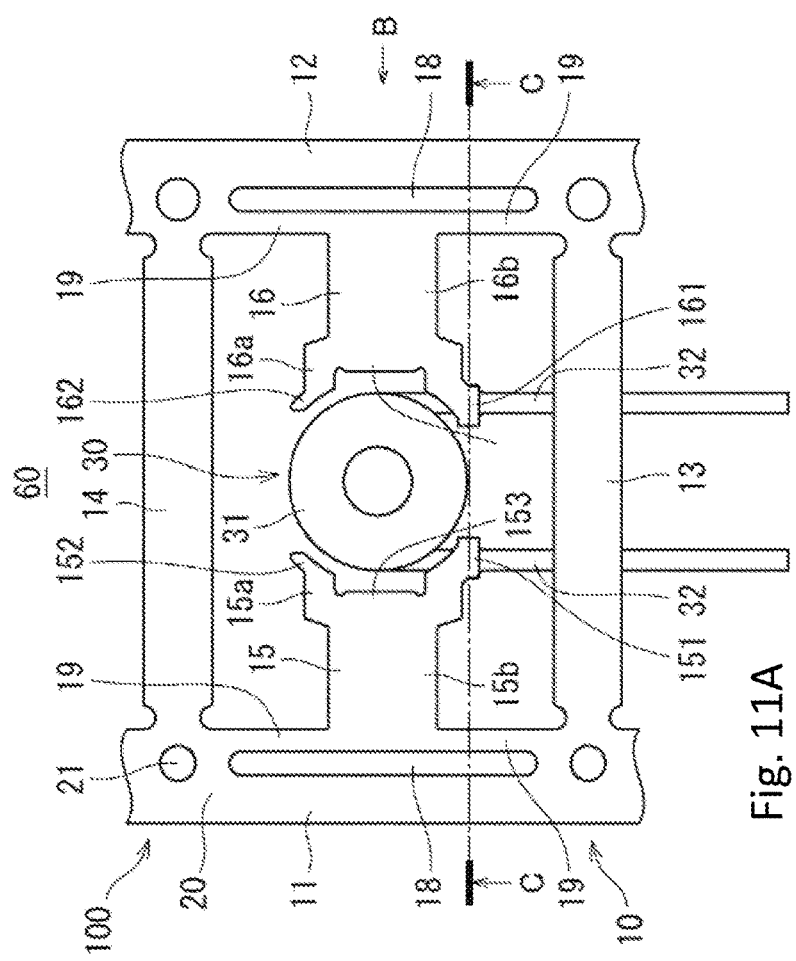
Figure 11C:
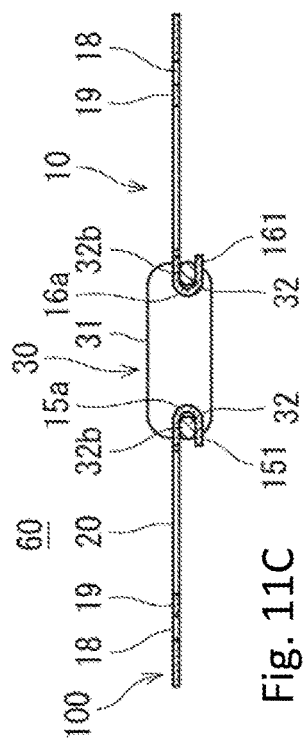

Next, as shown in FIGS. 11A-11C, the second clamping holding member 151 holds one of the terminals 32 when the second clamping holding member 151 is clamped, and at the same time, the second clamping holding member 161 holds the other of the terminals 32 when the second clamping holding member 161 is clamped. Specifically, for instance, while the clamping in which the second clamping holding members 151 and 161 are respectively bent by a punch is performed, an electric current is respectively applied from a tip of the punch to the second clamping holding members 151 and 161. As a result, each of the terminals 32 is clamped and fixed to the second clamping holding members 151 and 161 and is welded by resistance welding.

Next, as shown in FIGS. 12A-12C, an extended part of each of the terminals 32 is cut at a position which is in a distal end side than an area held by the second clamping holding members 151 and 161. Specifically, each of the terminals 32 is cut in the vicinity of the second clamping holding members 151 and 161. Here, the magnetic core 50 (FIGS. 14A and 14B) is formed in the region R shown by a dashed line in FIG. 12A.

Figure 13:
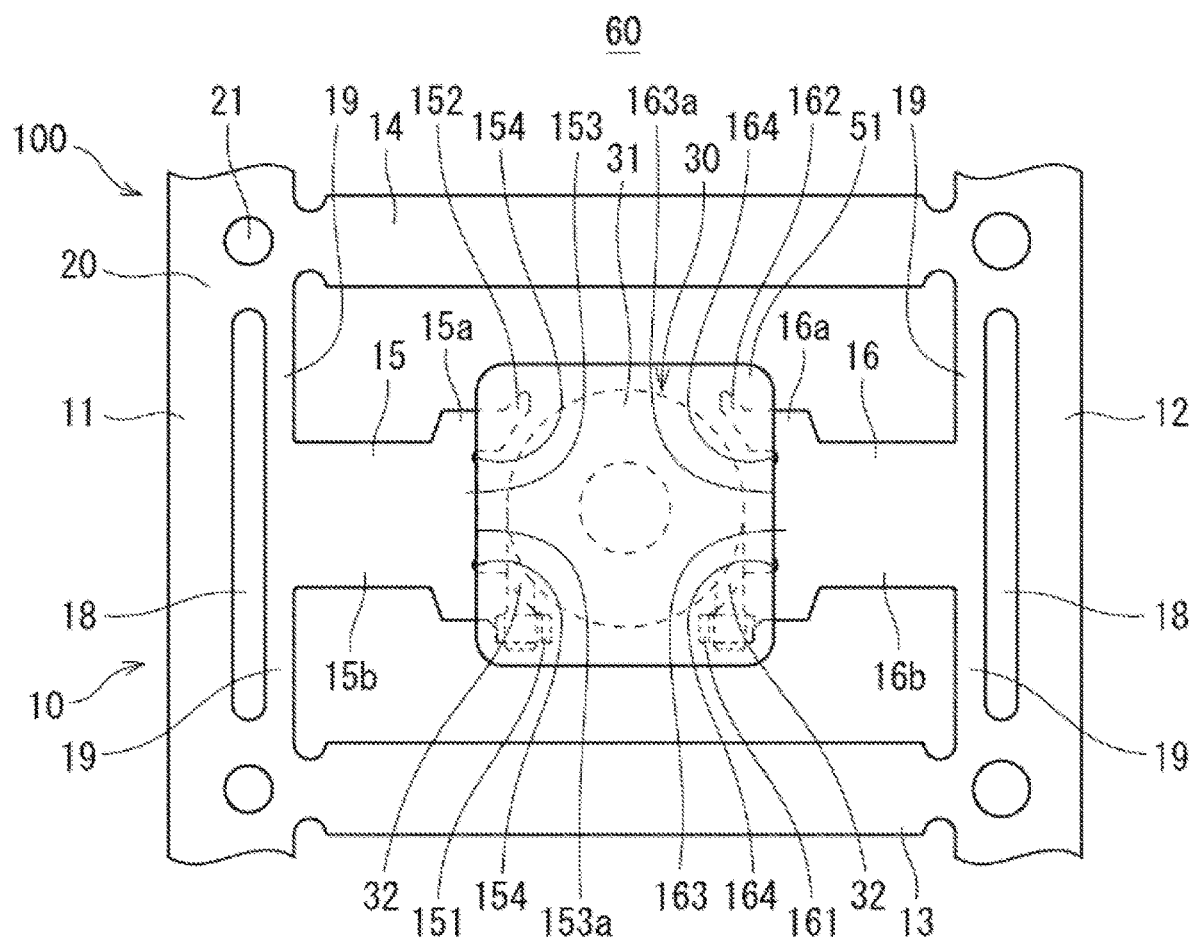
FIG. 13 is a plan view that shows a method for manufacturing an electronic component by using the terminal plate member according to the second embodiment of the present invention.
Figure 14A:
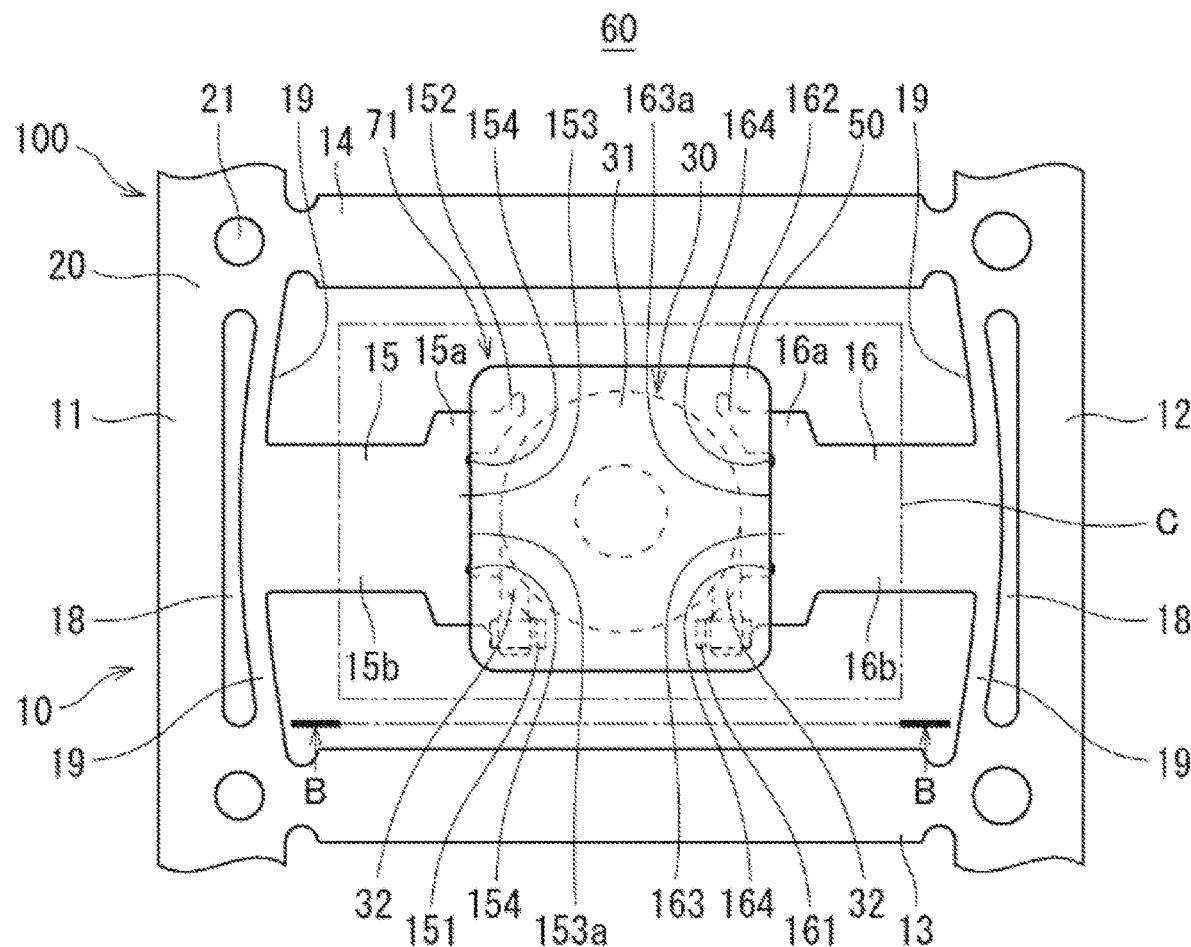
FIGS. 14A and 14B are views that show a method for manufacturing an electronic component by using the terminal plate member according to the second embodiment of the present invention. Specifically.
Figure 14B:
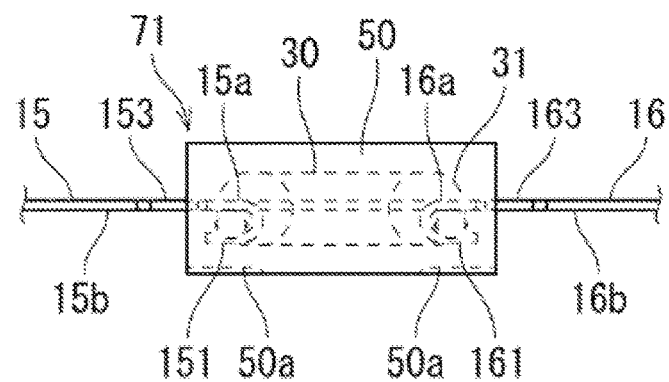

Next, in the same way as the first embodiment in which the explanation is provided by using FIG. 3, the magnetic core 50 is formed by using the mold 40. In the present embodiment, as shown in FIG. 13, the winding section 31, each of the terminals 32 of the coil component 30, the second clamping holding members 151 and 161, and the anchor parts 152 and 162 are covered by the magnetic powder 51. Further, an illustration of the mold 40 (FIG. 3) is omitted in FIG. 13. Thereafter, in the same way as the first embodiment, as shown in FIGS. 14A and 14B, the magnetic core 50 is formed (the pressurizing (pressing) process) by pressurizing the magnetic powder 51.

In the present embodiment, the extension members 15 and 16 are also displaced by being extruded in the extending directions of the extension members 15 and 16, and the displacement is absorbed by the slit 18 that corresponds to the easily-deformable section. That is, as shown in FIG. 14A, each of the extension members 15 and 16 is displaced in the direction away from the winding section 31 (in the direction away from the magnetic core 50), and the displacement is absorbed by the deformation of each of the connection parts 19. As a result, the strain of the terminal plate member 100 (the deformation of the terminal plate member 100) can be suppressed. Therefore, in regards to the magnetic core 50, a stress that is locally applied to the portion in which the extension members 15, 16 and the terminal 32 project can be suppressed.

As explained above, the method for manufacturing the electronic component according to the present embodiment can also be defined as explained below. That is, the method for manufacturing the electronic component according to the present embodiment includes: the preparation process of the terminal plate member 100 for the coil component; the preparation process of the coil component 30 that is configured by winding the conductive wire as the coil component, and is configured with the winding section 31 that is configured by winding the conductive wire and the pair of the terminals 32 that project from the winding section 31; the manufacturing process (the process in FIGS. 11A-12C) in which because each of the terminals 32 of the coil component 30 is placed on each of the extension members 15 and 16 of the terminal plate member 100, the coil component 30 and the terminal plate member 100 are assembled to each other (mutually combined) so that the semifinished product 60 is manufactured; the covering (filling) process (the process in FIG. 13) in which the semifinished product 60 is placed in the mold 40 and the semifinished product 60 is covered by magnetic powder 51; and the pressurizing (pressing) process (the process in FIGS. 14A and 14B) in which the magnetic core 50 is formed by pressurizing the magnetic powder 51. In the pressurizing (pressing) process, although the extension members 15 and 16 are displaced in the extending direction of the extension members 15 and 16, the displacement is absorbed by the easily-deformable sections.

After the semifinished product 60 is removed from the mold 40, as shown in FIG. 15A, each of the extension members 15 and 16 are cut at the base ends 15b and 16b so that an individual piece 72 is obtained from the semifinished product 60. Further, in regards to the semifinished product 60, an electronic component configuration member 71 that is a part in a region C shown in FIG. 14A corresponds to the individual piece 72.

Further, as shown in FIGS. 15B and 15C, the extension members 15 and 16 are respectively bent along the outer surface of the magnetic core 50. The positions in which the extension members 15 and 16 are bent are a location of the base ends of the second clamping holding member 151 and the anchor part 152 (a location along the base section tip edge 153a of the tip base section 153) and a location of the base ends of the second clamping holding member 161 and the anchor part 162 (a location along the base section tip edge 163a of the tip base section 163).

Further, as explained above, the edge notch 154 is respectively located adjacent to the base end of the second clamping holding member 151 and the anchor part 152, and at the same time, the edge notch 164 is respectively located adjacent to the base end of the second clamping holding member 161 and the anchor part 162. Therefore, the bending of the extension members 15 and 16 can be easily performed. In other words, the extension members 15 and 16 can be bent with a light force and beautifully.

Further, the second clamping holding members 151, 161 and the anchor parts 152, 162 respectively perform the anchor function for the magnetic core 50. As a result, this anchor function can prevent the extension members 15 and 16 from detaching from the magnetic core 50 when the extension members 15 and 16 are bent.

Further, as shown in FIGS. 14A and 15B, at a lower surface of the magnetic core 50, for instance, a pair of recessed parts 50a in which parts of the base ends 15b and 16b of the extension members 15 and 16 are respectively stored are formed. Thereafter, as shown in FIG. 15C, the parts of the base ends 15b and 16b are located in each of the recessed parts 50a. As a result, the electronic component 70 can be obtained.

According to the present embodiment explained above, because each of the terminals 32 of the coil component 30 can be held by the second clamping holding members 151 and 161 of the tips 15a and 16a of the extension members 15 and 16, a pull-out length of the terminals 32 from the winding section 31 of the coil component 30 can be shortened. As a result, a manufacturing cost can be suppressed. Even when the length of each of the terminals 32 is, for instance, shorter than the length shown in FIGS. 11A and 11B, the effect is sufficient. Further, by optimizing the length of the terminals 32 in advance, the cutting process of the terminals 32 that is explained in FIGS. 12A-12C can be omitted.

The terminal plate member of the coil component and the method for manufacturing the electronic component being thus described, it will be apparent that the same may be varied in many ways. Such variations are not to be regarded as a departure from the spirit and scope of the invention, and all such modifications as would be apparent to one of ordinary skill in the art are intended to be included within the scope of the following claims.

What is claimed is:

1. A terminal plate member on which a terminal of a coil component is mounted, the terminal plate member comprising:
an annular frame having an inner peripheral edge, the annular frame having positioning holes at four locations in total, margins of the annular frame consisting of a first margin, a second margin, a third margin, and a fourth margin;

a pair of extension members extending from the inner peripheral edge of the annular frame toward an inner space of the annular frame member in a first direction; and a deformable section provided in the annular frame at proximal end of one of the pair of extension members, the deformable section having a more easily deformable property than other sections of the annular frame when force is applied, wherein the deformable section is provided along at least an entire width in a second direction of the one of the pair of extension members, and the second direction is perpendicular to the first direction, the terminal plate member is positioned relative to another member by using the positioning holes, and a first hole of the positioning holes is located at an intersection of the first margin and the fourth margin, a second hole of the positioning holes is located at an intersection of the fourth margin and the second margin, a third hole of the positioning holes is located at an intersection of the second margin and the third margin, and a fourth hole of the positioning holes is located at an intersection of the third margin and the first margin.

2. The terminal plate member according to claim 1, wherein the deformable section is one of a through hole and a thin member, and a thickness of the thin member is thinner than a thickness of the other sections.

3. The terminal plate member according to claim 1, wherein a length of the deformable section in the second direction is longer than a length of the entire width in the second direction of the one of the pair of extension members.

4. The terminal plate member according to claim 1, wherein the deformable section is an elongated through hole, and the elongated through hole extends in the second direction, the annular frame includes:

an annular part having the inner peripheral edge; and a pair of connection parts extending along the elongated through hole, the pair of connection parts connecting bases of the pair of extension members to the annular frame, respectively, and wherein a first location of each of the pair of connection parts corresponding to each of the bases has a first notch, and a second location located an end of each of the pair of connection parts has a second notch.

5. The terminal plate member according to claim 1, wherein the entire width in the second direction of the one of the pair of extension members is larger than a width of the terminal of the coil component.

6. The terminal plate member according to claim 1, wherein each tip of each of the pair of extension members has a pair of branches in a bifurcated shape, and one of the pair of branches is a clamping holder, and the clamping holder holds the terminal of the coil component by clamping.

7. The terminal plate member according to claim 6, wherein the clamping holder rises from a top surface of the annular frame.

* * * * *